United States Patent [19]

Oak et al.

[11] Patent Number: 5,276,858
[45] Date of Patent: Jan. 4, 1994

[54] MEMORY CONTROLLER WITH INTEGRATED DELAY LINE CIRCUITRY

[75] Inventors: Jayawant V. Oak, Gold River; Robert N. Murdoch, Sacramento; Craig S. Walker, Grass Valley, all of Calif.; Thomas Heil, Easley, S.C.; Erez Carmel, Sacramento, Calif.

[73] Assignee: Intel Corporation, Santa Clara, Calif.

[21] Appl. No.: 814,116

[22] Filed: Dec. 26, 1991

[51] Int. Cl.$^5$ .............................................. G06F 1/04
[52] U.S. Cl. ..................................... 395/550; 395/275
[58] Field of Search ..................... 395/550; 364/953.7, 364/976.1, 238.41, 248.6, 940.61, 926.92, 238.3, 240.5, 242.6, 935.41

[56] References Cited

U.S. PATENT DOCUMENTS

| | | |
|---|---|---|
| 4,496,861 | 1/1985 | Bazes . |
| 4,796,232 | 1/1989 | House .................................. 365/189 |
| 4,975,605 | 12/1990 | Bazes . |
| 4,994,695 | 2/1991 | Bazes . |
| 5,001,671 | 3/1991 | Koo et al. ......................... 365/230.05 |
| 5,067,071 | 11/1991 | Schanin et al. .................. 364/242.6 |
| 5,168,570 | 12/1992 | Eckert et al. ..................... 364/242.6 |

Primary Examiner—Robert L. Richardson
Assistant Examiner—Moustafa Meky
Attorney, Agent, or Firm—Blakely, Sokoloff, Taylor & Zafman

[57] ABSTRACT

A memory controller apparatus for controlling access to a memory array from a microprocessor and a plurality of devices is described. The memory controller apparatus interfaces the microprocessor and the plurality of devices. The microprocessor functions asynchronously with the plurality of devices. The memory controller apparatus comprises a delay line circuitry coupled to receive a selected request for accessing the memory array from one of the microprocessor and the plurality of devices, the delay line means further including means for generating a plurality of memory timing control signals. The memory timing control signals are used for accessing the memory array. The delay line circuitry functions independently of any clock signal. The delay line circuitry is only triggered by the selected request. The memory controller apparatus further comprises a memory state circuitry coupled to the delay line circuitry for controlling sequence and timing of the memory timing control signals. The memory state circuitry is clocked by the memory timing control signals. A method of generating memory timing control signals in a memory controller apparatus is also described.

32 Claims, 31 Drawing Sheets

MEMORY CONTROLLER WITH INTEGRATED DELAY LINE CIRCUITRY

FIELD OF THE INVENTION

The present invention pertains to the field of memory controllers. More particularly, this invention relates to dynamic random access memory (DRAM) controllers that operate with external controlling devices having a different time base than the DRAM controller.

BACKGROUND OF THE INVENTION

In a prior microprocessor based system having memory, a microprocessor, as well as other circuitry, it is necessary to have clock or timing signals for various uses. For instance, when a microprocessor accesses a DRAM (i.e., dynamic random access memory) in the system, many clock signals are required from the microprocessor to latch addresses, decode the addresses, access the memory array, precharge nodes, control refreshing, etc.

The advances in the microprocessor technologies have led to the creation of high speed and high performance microprocessors. However, interfacing such a high speed, high performance microprocessor to a DRAM array requires the microprocessor to analyze many timings, to examine refresh cycle effects on bus timing, and to note minimum and maximum signal widths, which adversely affects the speed and performance of the microprocessor.

One prior solution to these problems is to design a DRAM controller that interfaces the microprocessor and the DRAM device. A prior DRAM controller typically provides complete control and timing for the DRAM device. The microprocessor interfaces to the DRAM controller. In such a prior DRAM controller, many techniques have been employed to generate the required timing signals internally.

Generally in the prior art, an internally generated system clock signal in the microprocessor is delayed to provide timing signals to access the DRAM array by using the charge-discharge characteristics of a resistor-capacitor network or of an MOS transistor-capacitor network. The length of the delay is controlled in these cases by the amount of resistance, capacitance or by the characteristics of an MOS transistor. The timing signals are then used to access the DRAM array.

One prior problem associated with this technique is that it does not provide accurate timing signals. The large variations, for example, in MOS circuit characteristics due to typical wafer processing, supply voltage variations and operating temperature cause substantial variations in timing delays.

One prior solution to solving this timing problem is to generate the timing signals in the DRAM controller by the use of a synchronous delay line. The synchronous delay line typically receives a clock signal and provides a series of taps, wherein each tap provides a timing pulse that has a precise delay from the commencement of a clock cycle which is initiated by the clock signal. The clock signal is applied from the microprocessor external to the DRAM controller and coupled to the synchronous delay line. The delay line is operating synchronously with the external microprocessor. The synchronous delay line then generates timing designed to have precise delays from the start of the clock signal. In addition, the timing signals are insensitive to variations from wafer processing, supply voltage and temperature.

Prior synchronous delay lines are described in (1) U.S. Pat. No. 4,496,861, issued on Jan. 29, 1985, entitled "INTEGRATED CIRCUIT SYNCHRONOUS DELAY LINE", in (2) U.S. Pat. No. 4,975,605, issued on Dec. 4, 1990, entitled "SYNCHRONOUS DELAY LINE WITH AUTOMATIC RESET", and in (3) U.S. Pat. No. 4,994,695, issued on Feb. 19, 1991, entitled "SYNCHRONOUS DELAY LINE WITH QUADRATURE CLOCK PHASES".

One disadvantage of the use of the synchronous delay lines in the DRAM controller is that the synchronous delay lines are designed to operate synchronously with the microprocessor's clock signal at a particular frequency. Because the synchronous delay lines in the DRAM controller function under the particular frequency of the clock signal, the delay lines depend on the type and speed of the external microprocessor. When the microprocessor is replaced with a new type of microprocessor having a higher frequency clock signal, the synchronous delay lines in the DRAM controller cannot generate the timing signals required for the DRAM under the new clock signal. Thus, the DRAM controller must also be replaced.

Another disadvantage of the use of the synchronous delay lines in the DRAM controller is that all input signals to the delay lines have to be delayed in order for the signals to be synchronized with the clock signal at the delay lines. This is typically done by having the controller wait for at least a couple of clock pulse periods in order to assure that an input signal is received and synchronized at the delay lines. In this case, the controller does not respond to the input signals immediately and much time is wasted in synchronizing the input signals.

Another disadvantage associated with the use of the synchronous delay line in the DRAM controller is that it is difficult, though not impossible, to transfer high frequency clock signal accurately and free of noise within the system. When the frequency of the clock signal of the microprocessor becomes higher and higher, more chip space is needed to ensure an accurate transfer of the clock signal to other devices within the system. Therefore, it is desirable to distribute the high frequency clock signal to as few places in the system as possible.

Another disadvantage associated with the use of the synchronous delay line in the DRAM controller is that the interface logic between the controller and other system devices becomes more complicated when the controller is a dual ported controller. A dual ported DRAM controller is connected both to the microprocessor in the system via a host bus and to other devices, such as system bus controller, peripheral controller, via a system bus. These other devices typically have access to the DRAM array through the controller directly without the involvement of the microprocessor. In this case, the controller is operating synchronously with the microprocessor under a higher frequency clock signal while these other devices in the system are operating under their clock signals of much lower frequencies. The clock signal of the microprocessor and that of the system devices are not synchronized to each other. Because the controller is operating synchronously with the microprocessor's clock signal, the communication between the controller and the other system devices typically requires a handshake operation. Therefore, additional logic is required to accomplish the operation.

SUMMARY AND OBJECTS OF THE INVENTION

A memory controller apparatus for controlling access to a memory array from a microprocessor and a plurality of devices is described. The memory controller apparatus interfaces the microprocessor and the plurality of devices. The microprocessor functions asynchronously with the plurality of devices. The memory controller apparatus, in one embodiment, comprises delay line circuitry coupled to receive a selected request from the microprocessor or one of the plurality of devices. In response to this selected request, the memory controller apparatus generates a plurality of memory timing control signals. The memory timing control signals are used for accessing the memory array. The delay line circuitry functions independently of any clock signal. The delay line circuitry is only triggered by the selected request to generate the memory timing control signals. The memory controller apparatus further comprises memory state circuitry coupled to the delay line circuitry for controlling sequence and timing of the memory timing control signals. The memory state circuitry is clocked by the memory timing control signals.

A method of generating memory timing control signals in a memory controller apparatus is described. The memory timing control signals are used to access a memory array. The method comprises the steps of:

(a) receiving a request from a microprocessor or a plurality of devices, wherein the microprocessor functions asynchronously with the plurality of devices;

(b) delaying the request to determine if the request is a memory access request;

(c) triggering a delay line means with the request to generate the memory timing control signals if the request is the memory access request, wherein the delay line means functions independently of any clock signal, wherein the delay line means is only triggered by the request to generate the memory timing control signals;

(d) providing memory state circuitry to control sequence and timing of the memory timing control signals.

One of the objects of the present invention is to provide a memory controller that generates timing control signals having a very high timing accuracy and being insensitive to variations from wafer processing, supply voltage and temperature, wherein the timing signals are employed to control the access of a memory device.

Another object of the present invention is to provide a memory controller that generates timing control signals independently of external clock signals, and therefore is independent of the type, speed and other characteristics of external devices.

Another object of the present invention is to provide a memory controller that operates synchronously with the operations of external devices having asynchronous time bases, therefore optimizing the operation of the memory controller with all the external devices.

A further object of the present invention is to provide a memory controller that allows no delay in responding to requests from any of the external devices operating asynchronously with each other.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
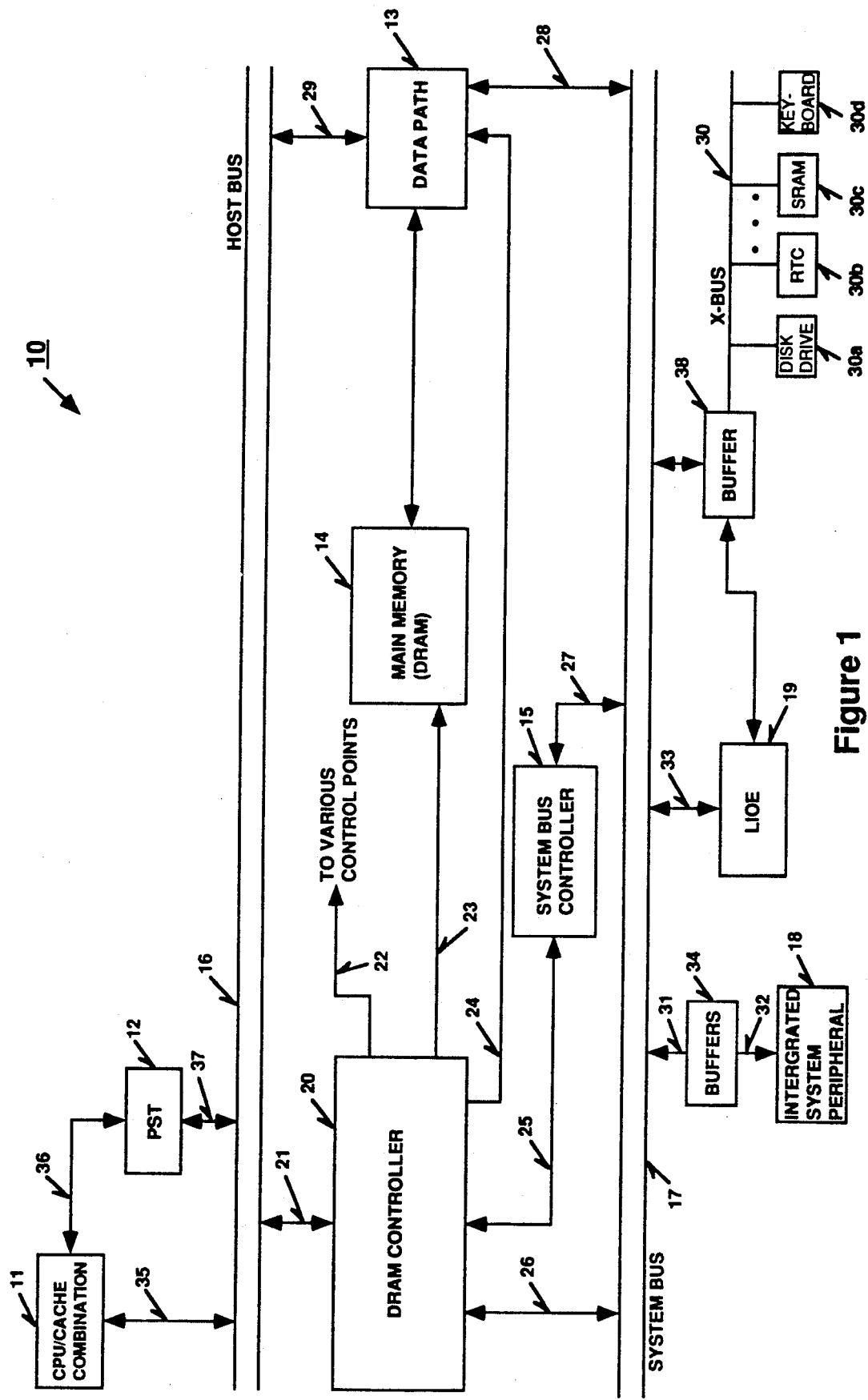
FIG. 1 is a block diagram of a microprocessor based computer system, including a DRAM based main memory and a memory controller.

FIG. 1 illustrates in block diagram form an architecture of a microprocessor based computer system 10, which implements a preferred embodiment of the present invention. FIG. 1 illustrates one configuration of computer system 10.

In the presently preferred embodiment, computer system 10 is an EISA system (i.e., Extended Industry Standard Architecture system). The Extended Industry Standard Architecture (EISA) is a high performance 32 bit architecture based on the Industry Standard Architecture (ISA). In alternative embodiments, computer system 10 can be any other type of computer system.

In FIG. 1, computer system 10 includes a host bus 16 connected to a CPU/cache combination 11. CPU/cache combination 11 typically contains a central processing unit (CPU) microprocessor (not shown) and a cache (not shown) connected to the microprocessor. In one embodiment, CPU/cache combination 11 includes a CPU microprocessor, a co-processor, a cache random access memory (RAM), and a cache controller for handling access to the cache RAM by the CPU microprocessor (CPU). In alternative embodiments, more or fewer than the elements mentioned above may be included in the combination. For instance, CPU/cache combination 11 may only include the CPU.

In one embodiment, the CPU is an 80386 microprocessor (i.e., i386 TM CPU) manufactured by Intel Corporation of Santa Clara, Cailf. In another embodiment, the CPU is an 80486 microprocessor (i.e., i486 TM CPU) also manufactured by Intel Corporation. In one embodiment, the co-processor is an 80387 (i.e., 387 TM ) co-processor manufactured by Intel Corporation. The cache controller, in one embodiment, is an 82385 cache controller which is also manufactured by Intel Corporation.

CPU/cache combination 11 is coupled to host bus 16 via bus 35. Bus 35 is used to transfer addresses and data between CPU/cache combination 11 and host bus 16. In addition, CPU/cache combination 11 is coupled to host bus 16 via a PST 12 (i.e., Programmable State Tracker). PST 12 is used to convert the CPU's clock-dependant handshake control signal from the CPU of CPU/cache combination 11 into a clock-less control signal (i.e., asynchronous with the CPU's clock signal) to host bus 16. In the preferred embodiment, PST 12 is implemented by programmable logic devices.

Computer system 10 also includes a system bus 17. System bus 17 is controlled to operate asynchronously with the CPU of combination 11. In other words, the timing signals generated in system bus 17 are asynchronous with the clock of the CPU of combination 11. In the presently preferred embodiment, system bus 17 is an EISA bus (i.e., Extended ISA bus). An ISA bus is a type of bus used in the Industry Standard Architecture compatible computers. The EISA bus is a superset of the ISA bus.

System bus 17 is also connected to a plurality of devices, such as an Integrated System Peripheral ("ISP") device 18 and a local I/O support peripheral device ("LIOE") 19. When one of the devices uses the EISA signal set to generate memory or I/O cycles (e.g., operations), the device is referred to as system master. When one of the devices uses the EISA signal set to accept cycles from various masters, it is referred to as system slave. A system slave returns information about its device type and data width.

System bus 17 couples the system masters to a main memory 14 via a DRAM controller 20. Bus 17 also acts as gateway for CPU accesses to system resources.

System bus 17 is coupled to a system bus controller 15 via bus 27. System bus controller 15 also connects with DRAM controller 20 via bus 25. System bus controller 15 provides data size and cycle translations between host bus 16 and system bus 17 during master cycles.

ISP 18 is coupled to system bus 17 via buses 31 and 32, and via buffers 34. ISP 18 provides a DMA (i.e., direct memory access) function, DRAM refresh, system arbitration, interrupt control, timer/counter functions, etc. When requested by ISP 18, bus controller 15 runs system bus cycles for DMA transfers and memory refreshes.

LIOE 19, in the presently preferred embodiment, is a local I/O EISA support peripheral device. LIOE 19 supports or integrates the I/O peripheral functions of computer system 10. In the preferred embodiment, LIOE 19 integrates all of the peripheral functions of system 10. LIOE 19 is coupled to a plurality of peripheral devices 30a through 30d via a peripheral bus (i.e., X-bus) 30. Peripheral bus 30 is a buffered version of an 8-bit bus. Thus, LIOE 19 is coupled to peripheral bus 30 via a buffer circuit 38. In the preferred embodiment, bus 30 is an 8-bit ISA bus which supports all of I/O functions of system 10. LIOE 19 provides the buffered control for each of the peripheral devices 30a-30d located on bus 30.

Peripheral devices 30a-30d are shown to include a disk drive 30a, a real time clock 30b, a static random access memory (SRAM) 30c, and a keyboard controller 30d. In practice, many more peripheral devices can be included. For example, a serial communication port, a parallel communication port, and a MODEM may be included.

DRAM controller 20 controls access to a main memory 14. In the presently preferred embodiment, main memory 14 contains a DRAM array. As can be seen from FIG. 1, DRAM controller 20 is a dual ported memory controller. DRAM controller 20 includes two ports (i.e., address gateways). One port is connected to CPU/cache combination 11 via bus 21, host bus 16 and bus 35. This port is exclusively used by the host. The port to which bus 21 is coupled is therefore referred to as "Host Port." The host port of DRAM controller 20 provides a one-way path for the host master (e.g., the CPU) to main memory 14 or to system bus 17.

The other port of DRAM controller 20 is connected to system bus 17 via bus 26. This port to which bus 26 is coupled is exclusively used by the system side of computer system 10. The port is therefore referred to as "System Port." The system port of DRAM controller 20 acts as the gateway to and from system bus 17.

Main memory 14 is coupled to a data path 13. Data path 13 is also coupled to host bus 16 via bus 29 and system bus 17 via bus 28. Data path 13 is used to transfer data read from main memory 14 to buses 16 and 17, and to transfer data written into main memory 14 from either bus 16 or bus 17. In one embodiment, data path 13 is implemented by a plurality of buffers.

Data path 13 is controlled by DRAM controller 20, the CPU, the system master and system bus controller 15. Data path 13 is used to buffer data to and from main memory 14, host bus 16, or system bus 17.

The host port of DRAM controller 20 is capable of accepting a host address and host cycle definition. From the address and cycle definition, DRAM controller 20 determines if the cycle is bound for main memory 14 or not. If the cycle is bound for main memory 14, DRAM controller 20 executes a DRAM access cycle. If the cycle is not bound for main memory 14, DRAM controller 20 forwards the cycle to system bus 17. The host port is considered one-way in direction because it is only capable of receiving host originated cycles. The system port is bi-directional, thus capable of sending as well as receiving addresses and system bus cycle definitions. The system port accepts system bus cycles and decides if the system cycle is for main memory 14 or not. If the system cycle includes an address for a memory access to a location in main memory 14, DRAM controller 20 executes a DRAM cycle. If the address of the system cycle is not contained in main memory 14, no action is taken by DRAM controller 20.

When DRAM controller 20 receives addresses and cycle definitions from host bus 16 and system bus 17 at the same time, DRAM controller 20 then arbitrates the requests and executes the cycle of the arbitration winner. The arbitration process is described below, in conjunction with FIGS. 8 and 19-21.

The dual ported architecture of DRAM controller 20 allows CPU activity to be isolated from the system bus activity. This allows the CPU to execute out of main memory 14 at the same time system bus activity is occurring. This design reduces CPU access time to main memory 14 significantly. This dual ported architecture provides four routes which a cycle may follow: (1) Host to main memory 14; (2) Host to system slave; (3) System master to main memory 14; and (4) System address to host cache.

When the CPU of combination 11 decides to access a system slave, the CPU generates a host-to-system cycle in which control signals and an address are sent to DRAM controller 20. DRAM controller 20 executes the cycle by passing the signals and the address to system bus 17. System bus controller 15 then converts the signals into its system protocol. In the presently preferred embodiment, controller 15 converts the signals into EISA specific protocol. The detailed description of this operation is provided below, in connection with the description of DRAM controller 20 in FIGS. 3-31.

CPU/cache combination 11 operates synchronously with a CPU clock signal. System bus 17 operates synchronously with a system clock signal. System bus 17, however, operates asynchronously to CPU/cache combination 11. In this case, computer system 10 presents two timing domains.

Figure 2:
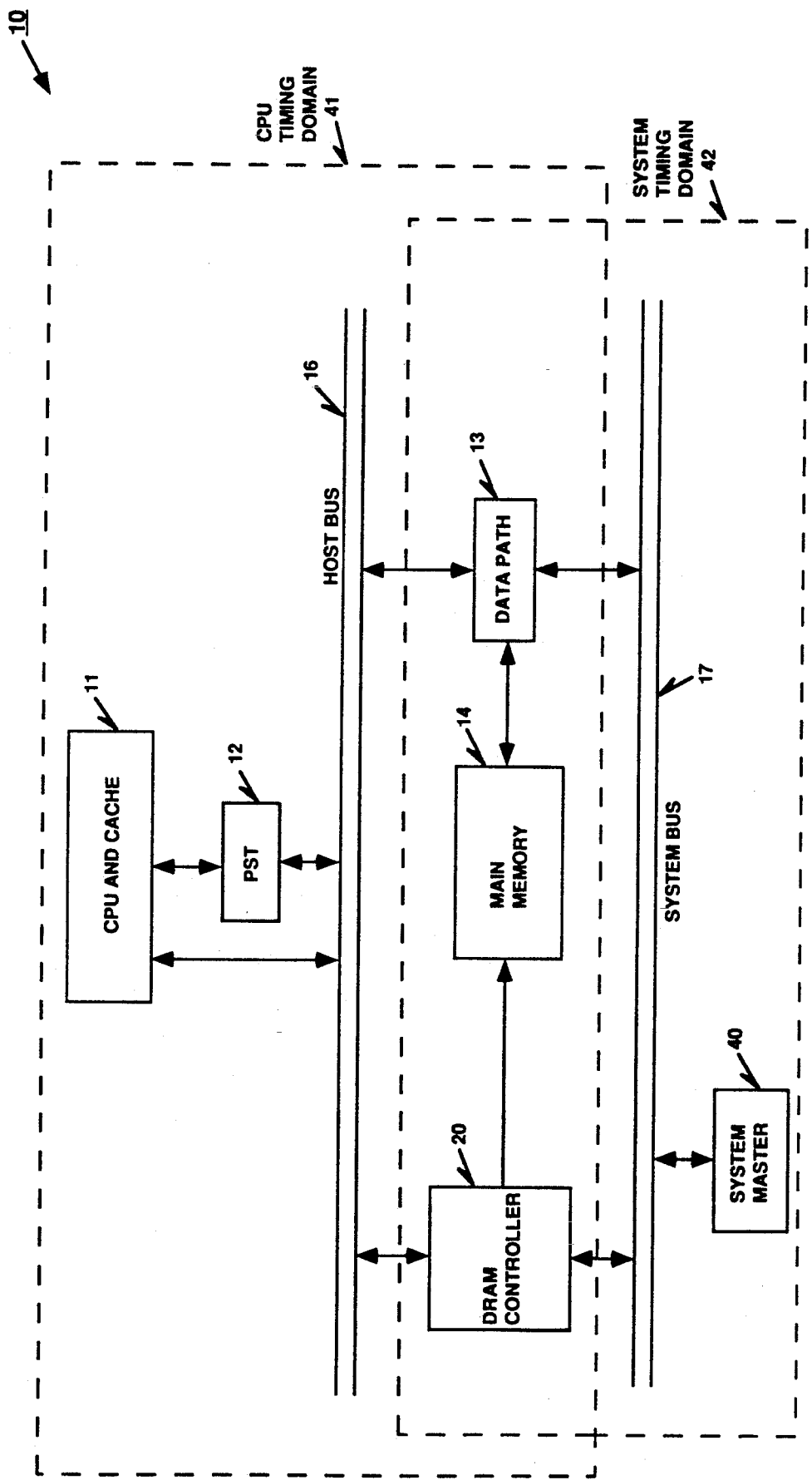
FIG. 2 illustrates two timing domains of the computer system.

FIG. 2 illustrates the two timing domains of computer system 10, namely, CPU timing domain 41 and system timing domain 42. Both timing domains are represented by dotted lines in FIG. 2. The two timing domains 41 and 42 are caused by different clock systems that are used in computer system 10. As is well known in the prior art, the CPU typically adopts a clock signal, of which the frequency is higher than that of a clock signal employed by a system device.

In the preferred embodiment of computer system 10, the CPU of combination 11 is operating under a clock signal of which the frequency ranges from 20 MHz to 50 MHz. System bus 17, however, is operating under a clock signal of which the frequency is between 2.5 MHz to 20 MHz. In one embodiment, the frequency of the CPU clock is 40 MHz while the frequency of system bus 17 is approximately 8.33 MHz.

CPU timing domain 41 is sequenced by the CPU clock (not shown). System timing domain 42 is sequenced by the system clock (not shown). As described above, the two clock signals are asynchronous to each other. As can be seen from FIG. 2, the two timing domains overlap over the memory subsystem which includes DRAM controller 20, main memory 14, and data path 13. This overlap is due to the fact that main memory 14 is shared by both the host CPU and system masters. The overlap indicates that the memory subsystem should be "synchronous" to either the CPU or a system master at any given time. However, as described above, the CPU is asynchronous to system bus 17. The operation of the memory subsystem, particularlt DRAM controller 20, requires a unique arrangement.

In the presently preferred embodiment, DRAM controller 20 operates asynchronously to the CPU and independent on the CPU clock frequency. On the other hand, DRAM controller 20 operates asynchronously to the system masters coupled to system bus 17 and independent of the clock frequency of the system masters. Therefore, DRAM controller 20 is operating asynchronously to either the CPU or the system masters to generate control signals to access main memory 14 or to perform a host-to-system cycle.

This asynchronous arrangement is implemented partly by employing the PSTs, including PST 12, in system 10. PST 12 serves to partition CPU/cache combination 11 from DRAM controller 20. As described above, the CPU in CPU/cache combination 11 is connected to PST 12. Similarly, each of the devices coupled to system bus 17 also include a PST. In this way, DRAM controller 20 can operate asynchronously to the CPU and system masters. The PSTs monitor the cycles of their respective masters and translate the cycles into the asynchronous protocol signals that are recognizable to DRAM controller 20.

PST 12 can be programmed to fit various CPU/cache combinations. PST 12 resides on the CPU module that contains CPU/cache combination 11. DRAM controller 20 and data path 13 reside on a mother board of system 10. Due to the use of PST 12, DRAM controller 20 is indifferent to the CPU/cache used. As described above, PST 12 translates CPU cycles into asynchronous protocol signals recognizable by DRAM controller 20. This allows different CPU/cache combinations to be connected to the same motherboard.

Because DRAM controller 20 is triggered by PST 12, DRAM controller 20 does not need to track the CPU clock directly, rather DRAM controller 20 monitors the signals from PST 12. When triggered by a host cycle generated by the CPU from PST 12, controller 20 responds by transferring to PST 12 the quantity of wait states to insert before a ready signal is returned to the CPU. PST 12 counts down from this quantity utilizing the CPU clock and then generates the ready signal to the CPU. From this, it can be understood that the CPU clock is limited to PST 12 and never reaches DRAM controller 20.

Although the asynchronous protocol is implemented between DRAM controller 20 and host bus 16 or system bus 17, the asynchronous protocol does not detriment CPU to memory or system master to memory performance. In this unique implementation, DRAM controller 20 is, however, still synchronously tracking the cycles generated by either the CPU or the system master. DRAM controller 20 starts to generate memory timing control signals to access main memory 14 upon the occurrence of the host cycle from the CPU or the system cycle from the system master. In this case, no wait state from the CPU is required and no synchronous delay for the transfer of the control signals and the address occurs. The unique arrangement of DRAM controller 20 is described in more detail below.

Figure 3:
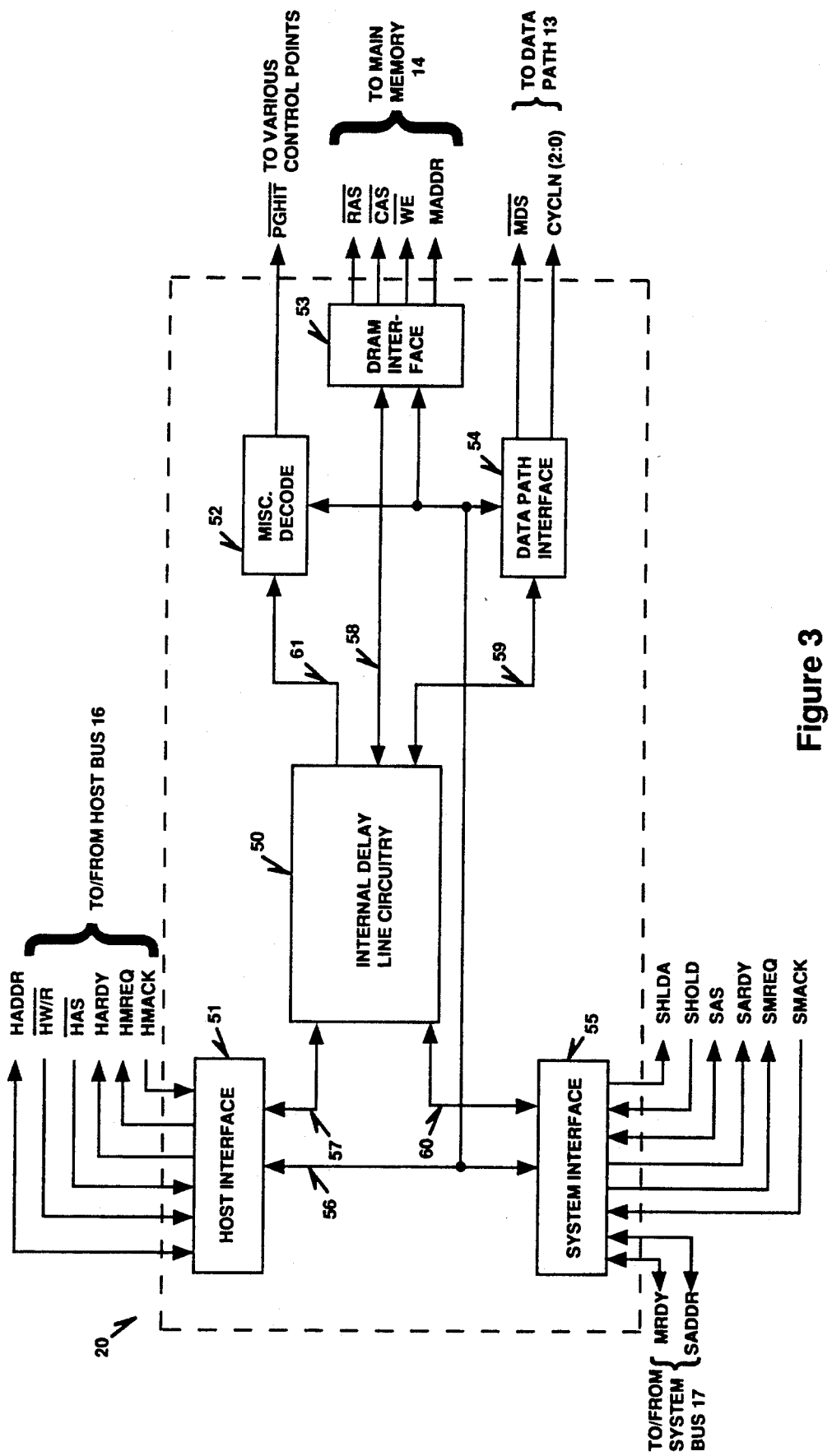
FIG. 3 is a functional block diagram of the memory controller, including an internal delay line circuitry.

FIG. 3 illustrates in block diagram form the structure of DRAM controller 20. In FIG. 3, DRAM controller 20 includes a host interface 51, a miscellaneous decode interface 52, a DRAM interface 53, a data path interface 54, a system interface 55, and internal delay line circuitry 50 coupled to these interfaces 51-55. Host interface 51 interfaces host bus 16. System interface 55 interfaces system bus 17 and system bus controller 15. Data path interface 54 interfaces data path 13. DRAM interface 53 interfaces main memory 14. Miscellaneous decode interface 52 is coupled to various control points of system 10.

Internal delay line circuitry 50 is coupled to interfaces 51-55 via lines 57 through 61. In the presently preferred embodiment, internal delay line circuitry 50 is integrated on the same substrate with interfaces 51-55. Interfaces 51-55 are interconnected to each other via bus 56. Bus 56 includes an address bus that transfers addresses between interfaces 51-55.

Internal delay line circuitry 50 generates memory timing control signals $\overline{RAS}$, $\overline{CAS}$, and $\overline{MDS}$ in DRAM controller 20 for accessing main memory 14 (FIG. 1). The use of a row address strobe ($\overline{RAS}$), and column address strobe ($\overline{CAS}$) with a memory array is well known in the art. Delay line circuitry 50 is triggered without a clock signal using signals of the asynchronous protocol from either host bus 16 (e.g., the host address strobe $\overline{HAS}$) or system bus 17 (e.g., the system address strobe $\overline{SAS}$). When the CPU in combination 11 is in control of DRAM controller 20 for access to main memory 14, delay line circuitry 50 is triggered by the $\overline{HAS}$ signal from PST 12 via host interface 51. When a system master on system bus 17 is in control of DRAM controller 20, delay line circuitry 50 is triggered by the $\overline{SAS}$ signal from the system master via system interface 55 and other signal triggers.

Host interface 51 is the gateway for host cycles (e.g., CPU controlled cycles) to access main memory 14 or system bus resources on system bus 17. Host interface 51 receives host addresses via the HADDR bus with status signals defining the host cycle. DRAM controller 20 monitors via host interface 51 these signals to determine the type and destination of the host originated cycle. Host interface 51 captures the host address and the cycle definition signals using the $\overline{HAS}$ signal.

Host interface 51 receives the host address strobe $\overline{HAS}$ signal from PST 12 (FIG. 1). The falling edge of the $\overline{HAS}$ is the host cycle start indicator to DRAM controller 20 and causes host interface 51 to latch in the host address and its cycle definition signals. The $\overline{HAS}$ rising edge indicates the end of the current host cycle and reopens host interface 51.

System interface 55 is responsible for communication between DRAM controller 20 and system bus controller 15. System interface 55 includes the function of transferring host-to-system cycles to bus controller 15. System interface 55 receives a system address and a cycle definition from system bus 17. The memory request signal from a system master is the system address strobe signal $\overline{SAS}$. The $\overline{SAS}$ signal indicates the beginning of a system cycle to DRAM controller 20. When the CPU is sending a cycle through DRAM controller 20 to system bus 17, the $\overline{SAS}$ signal becomes an output signal to system bus 17. When the CPU is not controlling system bus 17, the $\overline{SAS}$ signal is an input signal. The falling edge of an input $\overline{SAS}$ signal latches the system address in system interface 55 with the corresponding system status signals.

DRAM interface 53 provides all the signals needed for accessing main memory 14. These signals include a set of write enable $\overline{WE}$ signals, row address strobe $\overline{RAS}$ signals, and column address strobe $\overline{CAS}$ signals. Interface 53 also provides a memory address MADDR. Delay line circuitry 50 generates the $\overline{CAS}$ and $\overline{RAS}$ signals to access main memory 14.

Data path interface 54 includes a memory data strobe $\overline{MDS}$ signal to control data latching in data path 13. The $\overline{MDS}$ is also generated by delay line circuitry 50. During a memory read cycle, the $\overline{MDS}$ signal falls with the $\overline{CAS}$ signal. Delay line circuitry 50 then controls the $\overline{MDS}$ signal to delay for a precise period before causing $\overline{MDS}$ to go high and thereby latch the memory data in data path 13. Data path interface 54 also includes a cycle length feedback CYCLN output signal. The CYCLN signal includes a 3-bit code for the required quantity of wait states for the current host or system cycle.

Miscellaneous decode interface 52 includes a page hit $\overline{PGHIT}$ output signal. The $\overline{PGHIT}$ signal is asserted by controller 20 when controller 20 detects that current memory cycle has resulted in a memory page hit. This signal indicates that the current cycle is the fastest type of memory cycle.

Host interface 51 also includes a host memory request HMREQ output signal and a host memory acknowledge HMACK input signal. System interface 55 also includes a system memory request SMREQ output signal and a system memory acknowledge SMACK input signal. The HMREQ signal is asserted by DRAM controller 20 to PST 12 to indicate to the CPU that DRAM controller 20 wants ownership of main memory 14. DRAM controller 20 generates the HMREQ signal when there is a memory refresh request or a memory access request from a system master. The HMACK signal is an input signal to DRAM controller 20 from PST 12 in response to a request for memory ownership from DRAM controller 20 (HMREQ). The asserted HMACK signal indicates that the HMREQ signal has been honored and that DRAM controller 20 has ownership of main memory 14.

Similarly, when the host CPU wants memory 14 ownership or a memory refresh is required, DRAM controller 20 asserts the SMREQ signal to system PSTs. The system PST then generates the SMACK to system interface 55. The asserted SMACK signal indicates that the system masters have released memory ownership to DRAM controller 20. When the SMACK is deasserted (low), the system master has memory ownership.

System interface 55 further includes a system hold SHOLD input signal and a system hold acknowledge SHLDA output signal. The SHOLD signal indicates to controller 20 that a system master is requesting ownership of system bus 17. DRAM controller 20 responds with the SHLDA signal when it has given ownership of system bus 17 to the system master. The SHLDA signal remains asserted as long as the SHOLD signal remains asserted. When DRAM controller 20 asserts the SHLDA signal, system interface 55 is tri-stated with its output function. The SHOLD and SHLDA signals are used for the host-to-system cycle.

Figure 4:
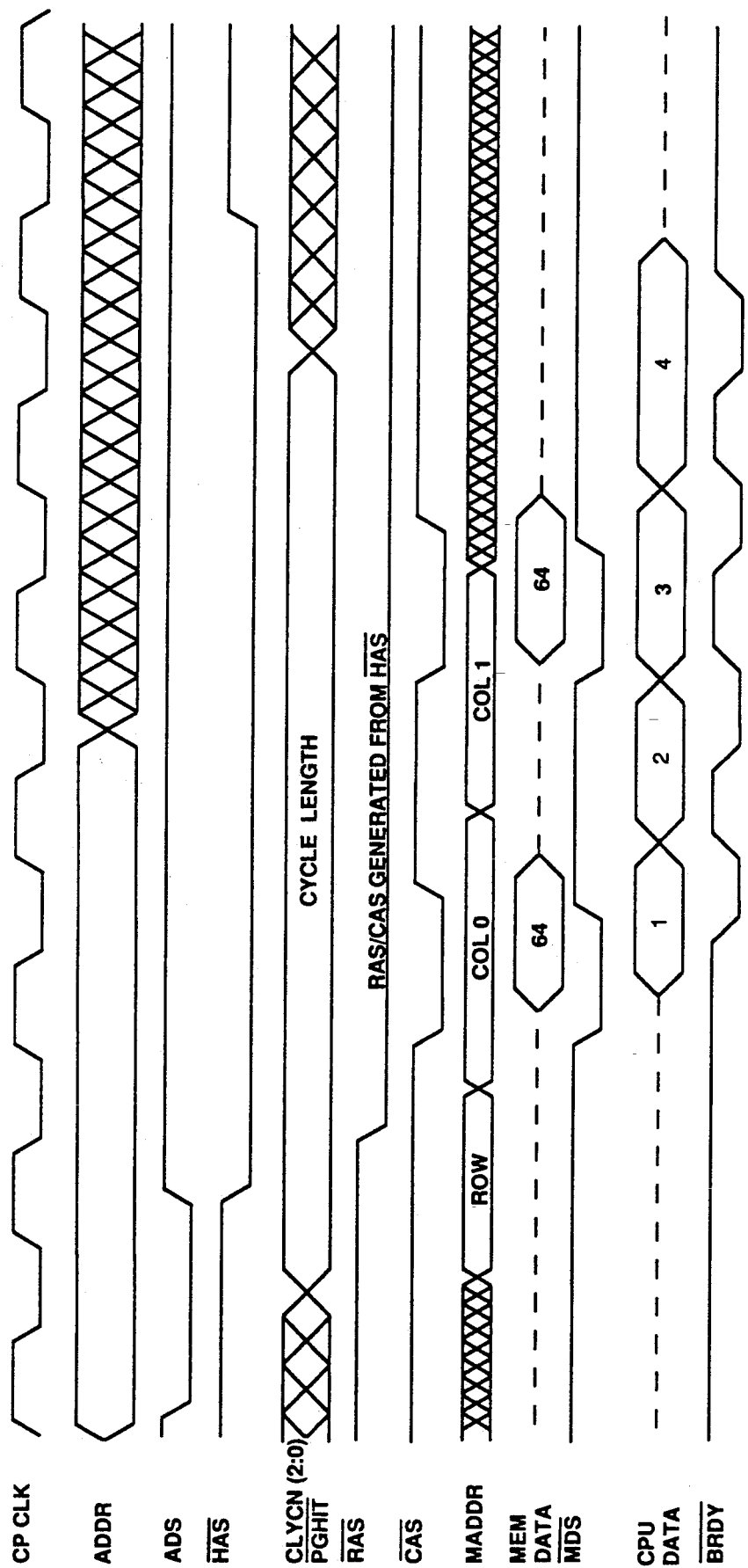
FIG. 4 illustrates the signal waveforms of the computer system in connection with a memory read cycle from the CPU.

FIGS. 4-7 illustrate the signal waveforms of system 10 in connection with a host cycle. FIG. 4 illustrates a memory read cycle for the host CPU. In FIG. 4, the CPUCLK signal is the clock signal of the CPU. The ADDR signal represents the address from the CPU to controller 20. The $\overline{\text{ADS}}$ signal is generated by the CPU to start the memory read cycle. When PST 12 receives the active $\overline{\text{ADS}}$ signal (low), PST 12 generates the $\overline{\text{HAS}}$ signal (falling edge) to DRAM controller 20. DRAM controller 20 then responds with cycle length CYCLN and page hit $\overline{\text{PGHIT}}$ information via data path interface 54 and miscellaneous decode interface 52. PST 12 counts down from the CYCLN value and then terminates the cycle with a ready signal (not shown) to the CPU. Meanwhile, delay line circuitry 50 is triggered by the $\overline{\text{HAS}}$ strobe to generate the timing signals $\overline{\text{RAS}}$, $\overline{\text{CAS}}$ and $\overline{\text{MDS}}$ for main memory 14. The row address is latched in with the $\overline{\text{RAS}}$ strobe. The column address is latched in with the $\overline{\text{CAS}}$ strobe. Data (MEM DATA) is latched into data path 13 with the rising edge of the $\overline{\text{MDS}}$ strobe and thereafter fetched by PST 12. In FIG. 4, it is assumed that main memory 14 is 64 bit wide. In this case, two $\overline{\text{CAS}}$ pulses are necessary to complete the read operation.

Figure 5:
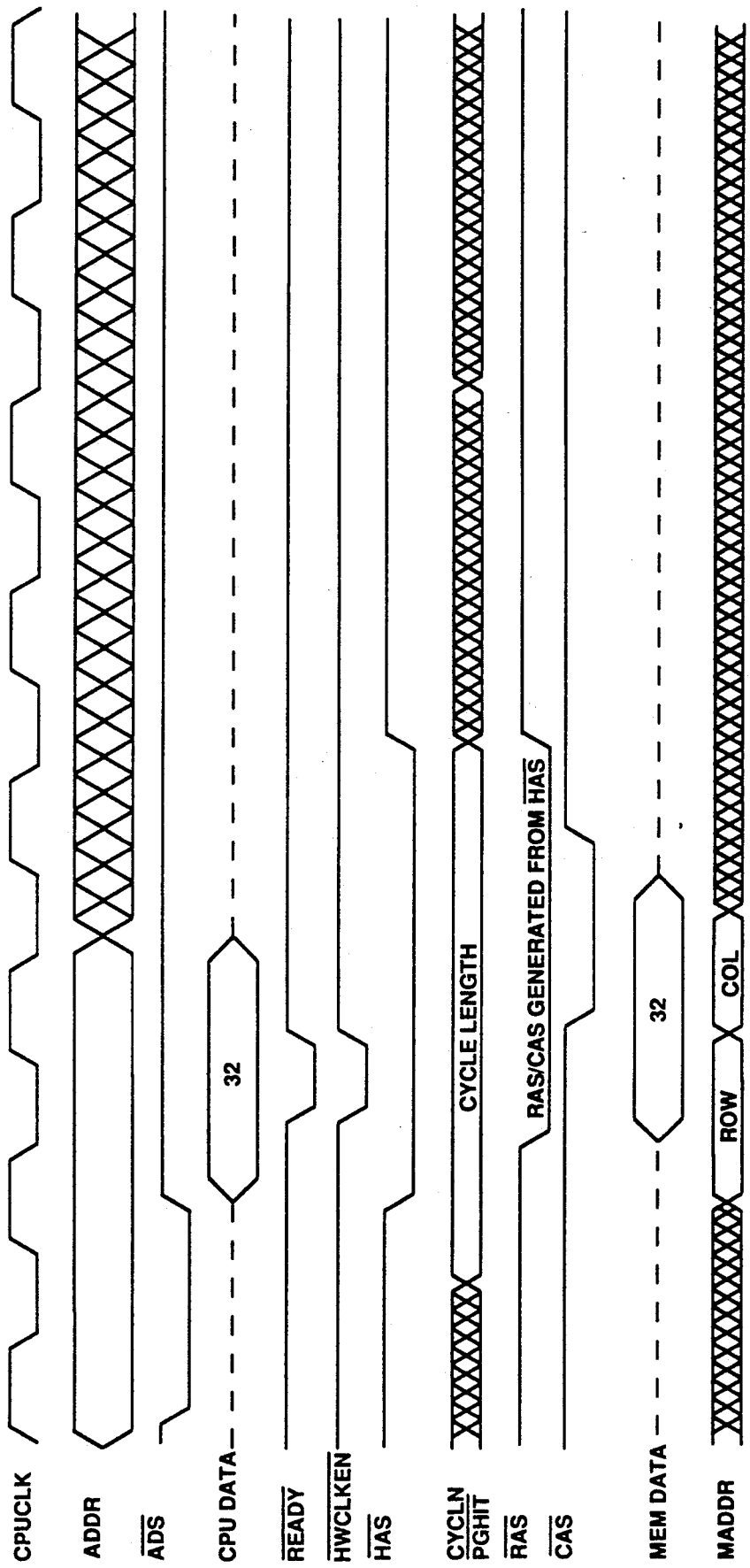
FIG. 5 illustrates the signal waveforms of the computer system in connection with a memory write cycle from the CPU.

FIG. 5 illustrates signal waveforms of system 10 in a host cycle in which the CPU writes to main memory 14. In FIG. 5, the CPU first generates the $\overline{\text{ADS}}$ signal, along with the CPU data to be written into main memory 14. The data is posted to data path 13 with a $\overline{\text{HWCLKEN}}$ signal. The $\overline{\text{HWCLKEN}}$ signal is generated by PST 12 to data path 13 that qualifies the posted CPU data. Meanwhile, PST 12 generates a ready signal to the CPU to release the CPU. The CPU may then proceed with additional write cycles or start a new host cycle. For delay line circuitry 50, the write cycle proceeds similar to the read cycle. The $\overline{\text{PGHIT}}$ signal and the CYCLN signal are still used by PST 12. If the CPU generates another memory cycle before the CYCLN value has decremented to zero, PST 12 must hold off the next cycle by withholding the next $\overline{\text{HAS}}$ falling edge until the write is complete.

Figure 6:
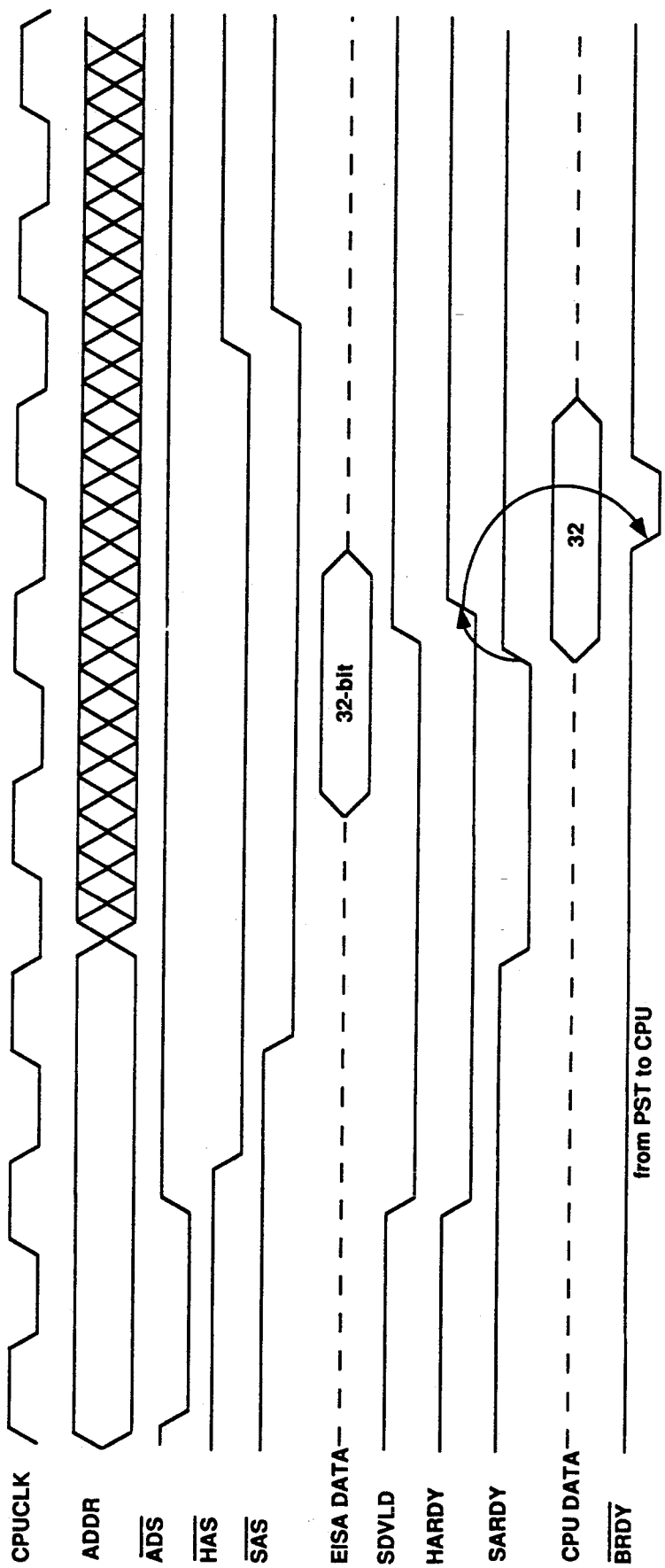
FIG. 6 illustrates the signal waveforms of the computer system in connection with a system slave read cycle from the CPU.

FIG. 6 illustrates the timing signals in a host-to-system cycle. In this cycle, the CPU needs to read data from a system slave. As can be seen from FIG. 6, the CPU indicates the start of the cycle by activating the $\overline{\text{ADS}}$ signal. PST 12 then generates the $\overline{\text{HAS}}$ to controller 20. Controller 20 decodes the address and finds that it does not reside in main memory 14 and thus is directed to system bus 17. At this time, DRAM controller 20 deactivates an asynchronous ready (HARDY) signal causing PST 12 to insert wait states until the HARDY signal is returned to the asserted state (high).

Triggered by the falling edge of the $\overline{\text{HAS}}$ signal, delay line circuitry 50 generates a low $\overline{\text{SAS}}$ signal to system bus controller 15 via system interface 55. The $\overline{\text{SAS}}$ signal indicates to bus controller 15 that a system bus cycle should be initialized. At this time, the $\overline{\text{SAS}}$ signal is the output signal of DRAM controller 20. FIG. 6 shows an example of an i486 microprocessor accessing EISA/ISA memory.

System bus controller 15 then initializes a system bus cycle to access the system slave the CPU intends to access and returns a system ready signal SARDY to DRAM controller 20. When the current system bus cycle is completed, system bus controller 15 deasserts the SARDY signal to DRAM controller 20. This then results in the rising edge of the HARDY signal to PST 12.

When the data (EISA DATA) is secured in data path 13 from the system slave the CPU is accessing, bus controller 15 activates a SDVLD signal to data path 13, indicating that the data is valid and thereby locking the data into data path 13. PST 12 then synchronizes the HARDY signal with the CPU clock and generates the ready signal $\overline{\text{BRDY}}$ to the CPU. It shall be noted that the synchronization operation by PST 12 happens in parallel with the next cycle.

Figure 7:
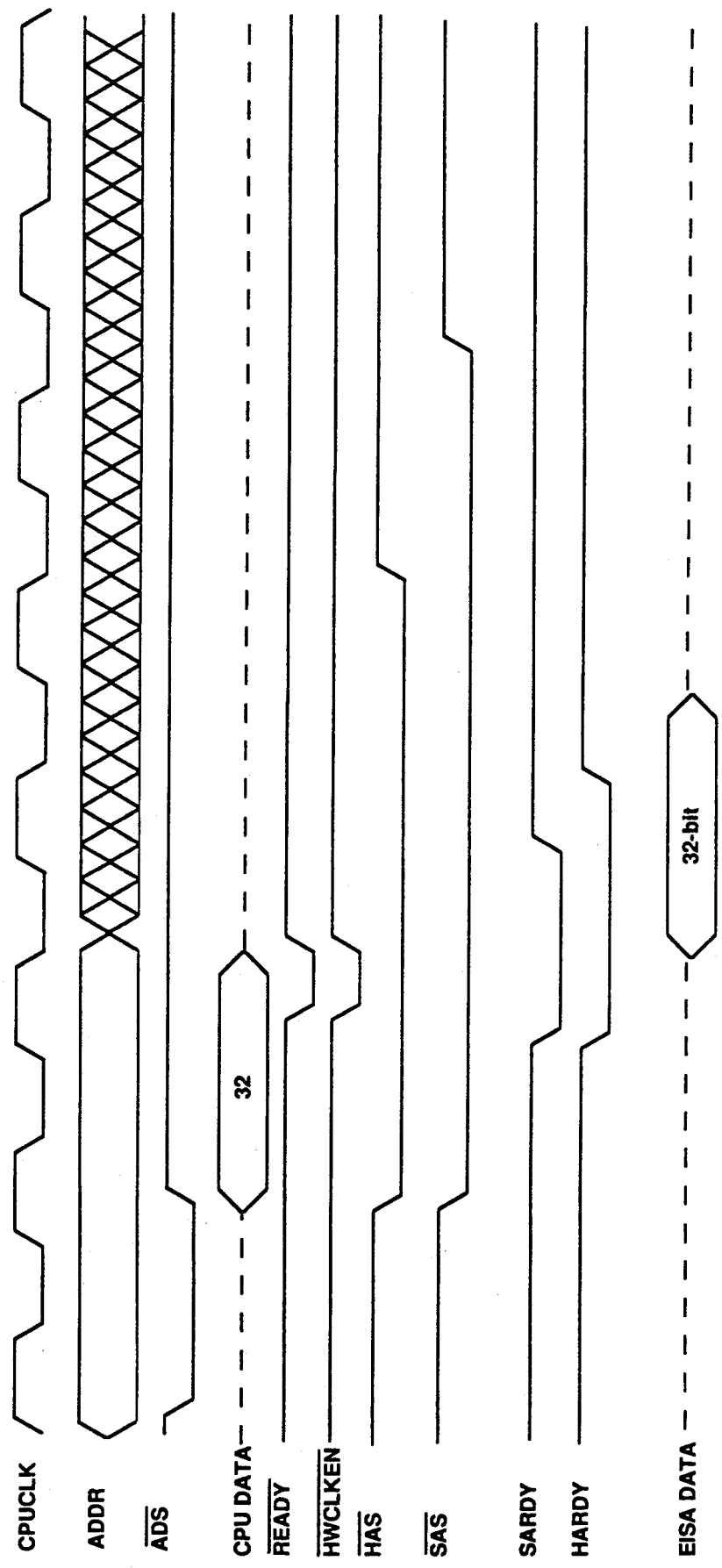
FIG. 7 illustrates the signal waveforms of the computer system in connection with a system slave write cycle from the CPU.

FIG. 7 illustrates the signal waveforms of a host-to-system write cycle. This cycle is similar to a host-to-memory write cycle in that the data is posted into data path 13 and qualified by a $\overline{\text{HWCLKEN}}$ signal from PST 12 to data path 13. When the data is qualified, the CPU is given the $\overline{\text{READY}}$ signal from PST 12. Delay line circuitry 50 is triggered by the $\overline{\text{HAS}}$ signal and generates the $\overline{\text{SAS}}$ system address strobe signal to system bus controller 15. Controller 20 then deactivates the ready signal HARDY to PST 12.

When system bus controller 15 transfers the data to a latch in the system side of data path 13, system bus controller 15 returns a system ready signal SARDY to controller 20. The SARDY signal is then translated by controller 20 and driven as HARDY to PST 12. The HARDY pulse will be ignored if no new cycles have been initiated by PST 12. If another cycle is pending, the new cycle will be stalled until the HARDY signal is activated.

It shall, however, be understood that DRAM controller 20 is not limited to the above-mentioned signals. Other signals of DRAM controller 20 are not shown or described in order not to unnecessarily obstruct the description of the preferred embodiment of the present invention.

Figure 8:
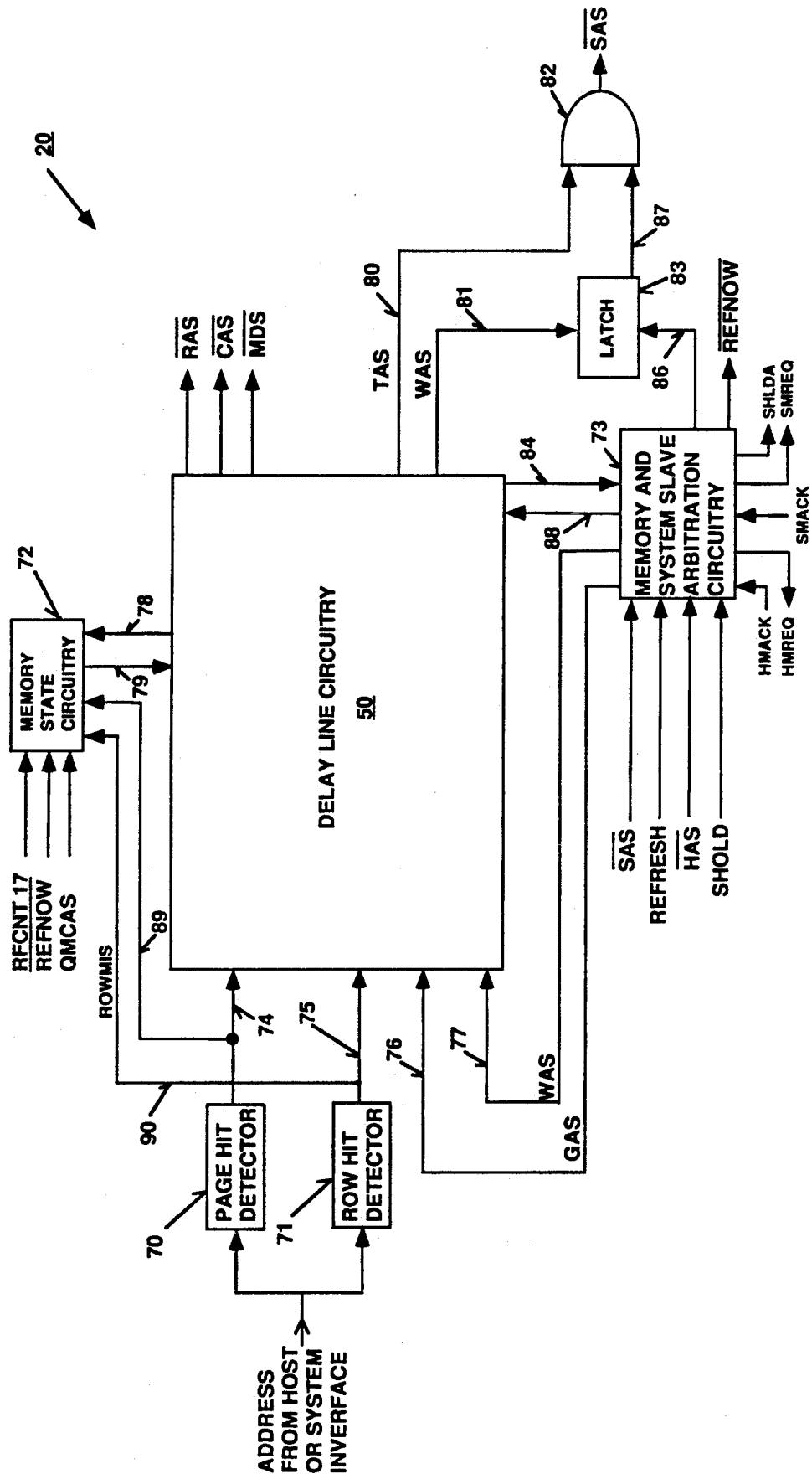
FIG. 8 is another block diagram of the DRAM controller, including the delay line circuitry, a page hit detector, a row hit detector, a memory state circuitry, and a memory and system slave arbitration circuitry.

Referring now to FIG. 8, DRAM controller 20 is shown to include a page hit detector 70, a row hit detector 71, memory state circuitry 72, and a memory and system slave arbitration circuitry 73. These devices 70-73 are associated with delay line circuitry 50.

Page hit detector 70 and row hit detector 71 are associated with interfaces 51-55 of FIG. 3. Memory state circuitry 72 is associated with interfaces 52 and 53 of FIG. 3. Memory and system slave arbitration circuitry 73 is associated with host and system interfaces 51 and 55.

Page hit detector 70 and row hit detector 71 receive addresses from host interface 51 or system interface 55 via bus 56 to detect if a column address received is a page hit address and whether a row address received is a row hit address. Detectors 70 and 71 then apply their outputs to internal delay line circuitry 50 via lines 74-75.

DRAM controller 20 can execute a page hit memory cycle, a page miss memory cycle, and a row miss cycle. A page hit is a memory cycle in which the same page of main memory 14 is addressed as the preceding memory cycle. Clearly, in this case, the row of main memory 14 being accessed by the $\overline{\text{RAS}}$ signal must have been left in the asserted state from the previous DRAM access. Because the current access is to the same DRAM page, no manipulation of the row address strobe $\overline{\text{RAS}}$ is required and access time is limited to the time required to manipulate the $\overline{\text{CAS}}$ signal only.

A page miss is a memory cycle in which the current memory cycle is for access to a row for which the $\overline{\text{RAS}}$ signal has been left active from the previous memory cycle, but the current access is to a different DRAM page. In this case the $\overline{RAS}$ signal must be deasserted and the row precharge time must be satisfied before a new DRAM row address can be strobed into the DRAMs by asserting the $\overline{RAS}$ signal.

A row miss is a memory cycle which accesses a row whose $\overline{RAS}$ signal was not left in the asserted state. In this case, part or all of the required row precharge has been satisfied during the time the $\overline{RAS}$ was high. Thus the $\overline{RAS}$ signal may be asserted immediately if row precharge has been met.

It shall be noted that the $\overline{RAS}$ signal is deasserted (high) at the end of each system cycle. The $\overline{RAS}$ signal is also deasserted whenever a change in memory ownership occurs.

Page hit detector 70 and row hit detector 71 test the current address to determine if it is a page hit, a page miss, or a row miss memory cycle needs to be executed. Detectors 70 and 71 then apply their outputs to delay line circuitry 50 via lines 74 and 75 and to memory state circuitry 72 via lines 89 and 90 such that delay line circuitry 50 can generate the $\overline{RAS}$ signal accordingly.

Figure 9:
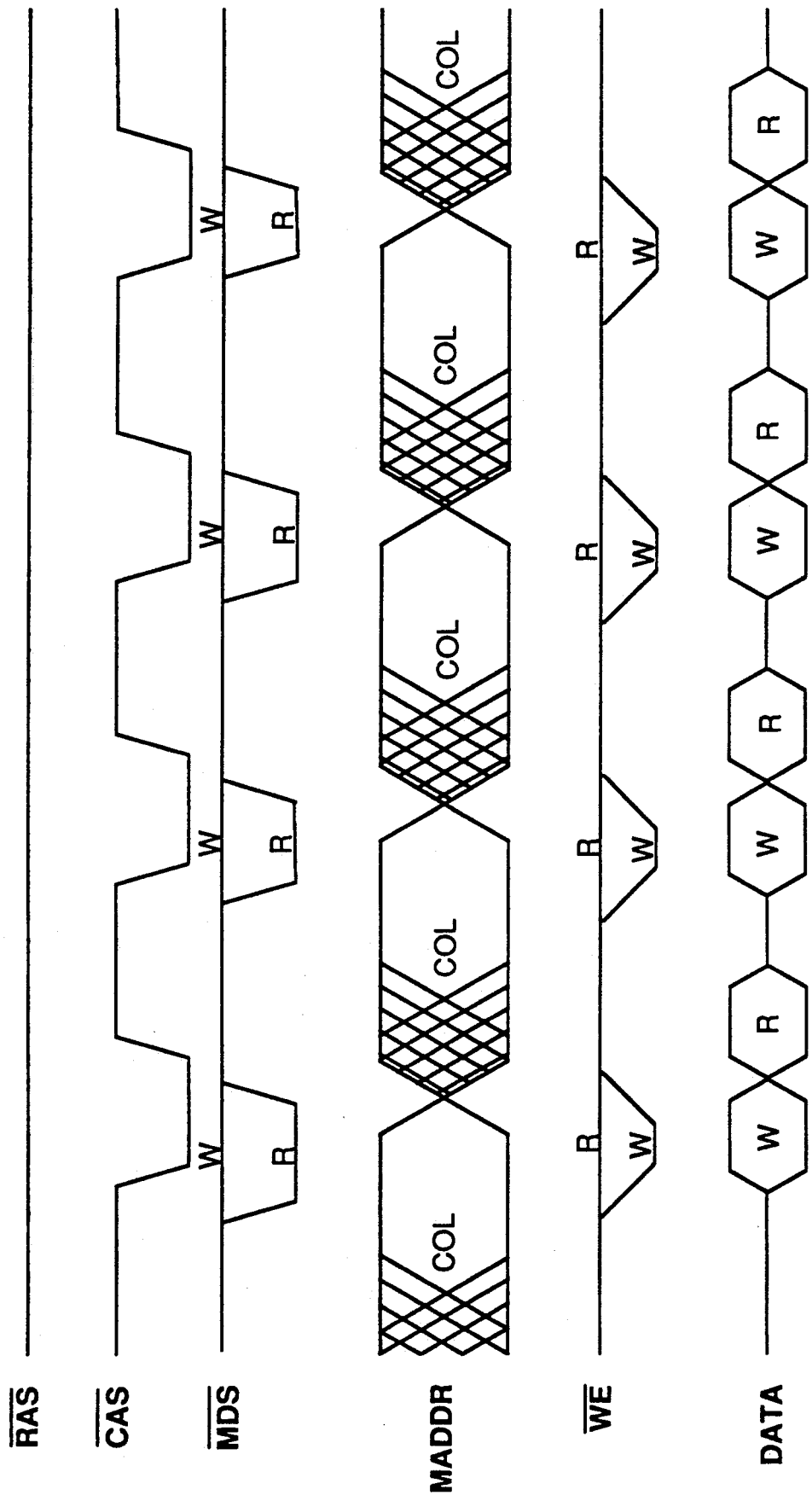
FIG. 9-11 illustrate the signal waveforms of the $\overline{\text{RAS}}$, $\overline{\text{CAS}}$ and $\overline{\text{MDS}}$ signals in page hit, page miss, and row miss cycles.
Figure 10:
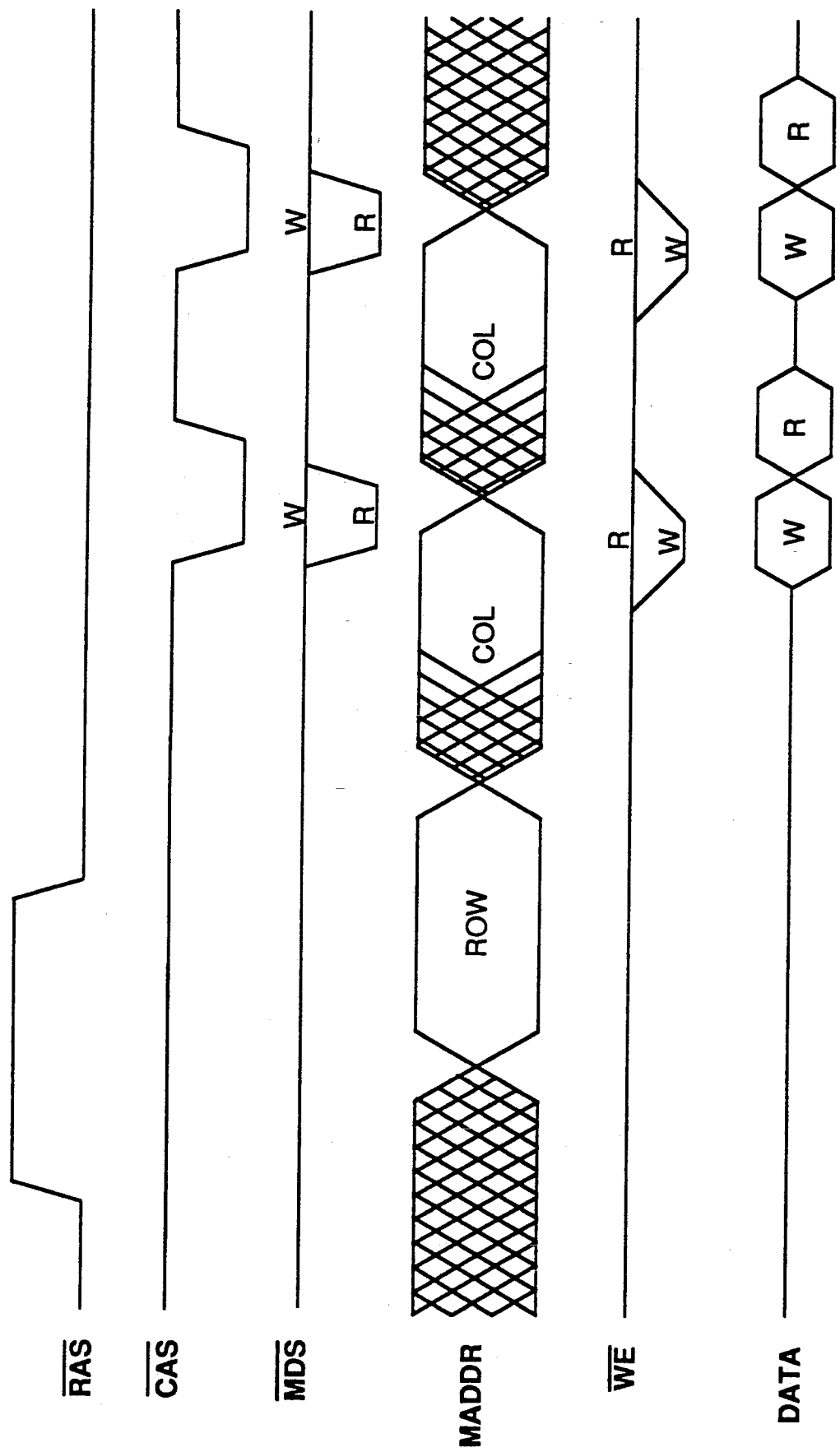
Figure 11:
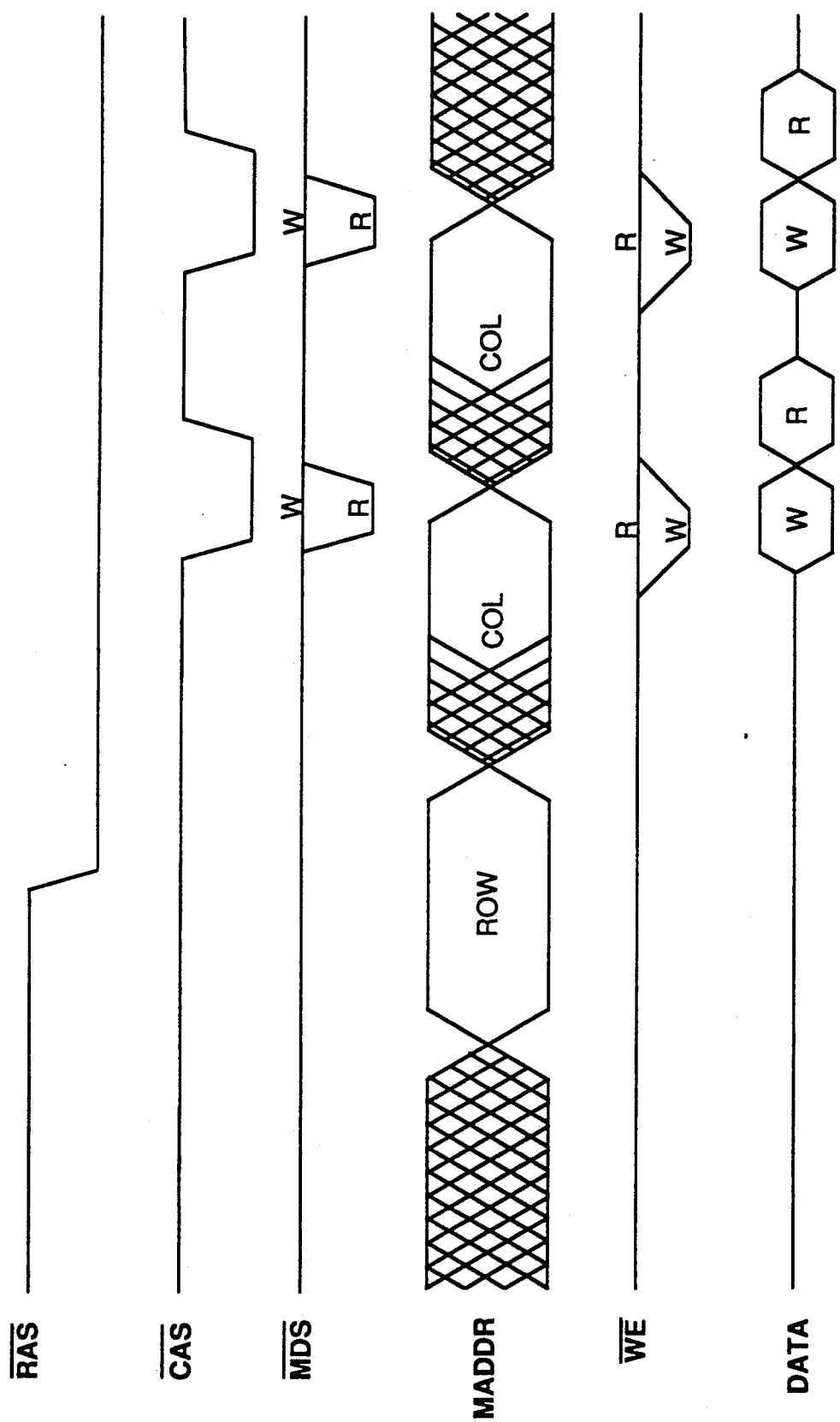

FIGS. 9 through 11 illustrate the $\overline{RAS}$, $\overline{CAS}$, and $\overline{MDS}$ signals in these three cycles. FIG. 9 illustrates the page hit cycle. FIG. 10 illustrates the page miss cycle and FIG. 11 illustrates the row miss cycle. FIGS. 9-11 show both the memory read and write cycles. When a memory write cycle is initiated, the $\overline{WE}$ signal is activated (low) and the data is presented at the W window for writing into main memory 14. At this time, the low $\overline{MDS}$ signal is not generated. When a memory read cycle is initiated, no $\overline{WE}$ pulse is generated and the data is read at the R window with the $\overline{MDS}$ pulses as shown.

Referring back to FIG. 8, delay line circuitry 50 receives its triggering signals WAS and GAS from memory and system slave arbitration circuitry 73. The WAS signal is the arbitrated $\overline{HAS}$ signal. The GAS signal is the arbitrated $\overline{SAS}$ signal. Memory and system slave arbitration circuitry 73 arbitrates memory ownership among the memory requests received from the CPU, the system master, and against the internal DRAM refresh requirement. Other signals associated with memory and system slave arbitration circuitry 73 include a REFRESH signal from an internal refresh counter (not shown), the HMREQ signal, the HMACK signal, the SMREQ signal, the SMACK signal, the SHOLD signal, the SHLDA signal, and an arbitrated refresh output signal $\overline{REFNOW}$ to memory state circuitry 72. The HMREQ, HMACK, SMREQ, SMACK, SHOLD, and SHLDA signals were described above. The $\overline{REFNOW}$ signal is applied to memory state circuitry 72 to cause it to latch the refresh cycle into memory state circuitry 72.

Delay line circuitry 50 is triggered by the arbitrated WAS or GAS signal and thereafter generates the $\overline{RAS}$, $\overline{CAS}$, and $\overline{MDS}$ signals. Delay line circuitry 50 receives the cycle type and state information of the current memory access from page hit detector 70, row hit detector 71, and memory state circuitry 72. The cycle type and state information is used by delay line circuitry 50 to generate the appropriate $\overline{RAS}$, $\overline{CAS}$, and $\overline{MDS}$ signals for the cycle (see FIGS. 9-11). The structure of delay line circuitry 50 is shown in block diagram form in FIG. 12, which is described in detail below.

Figure 12:
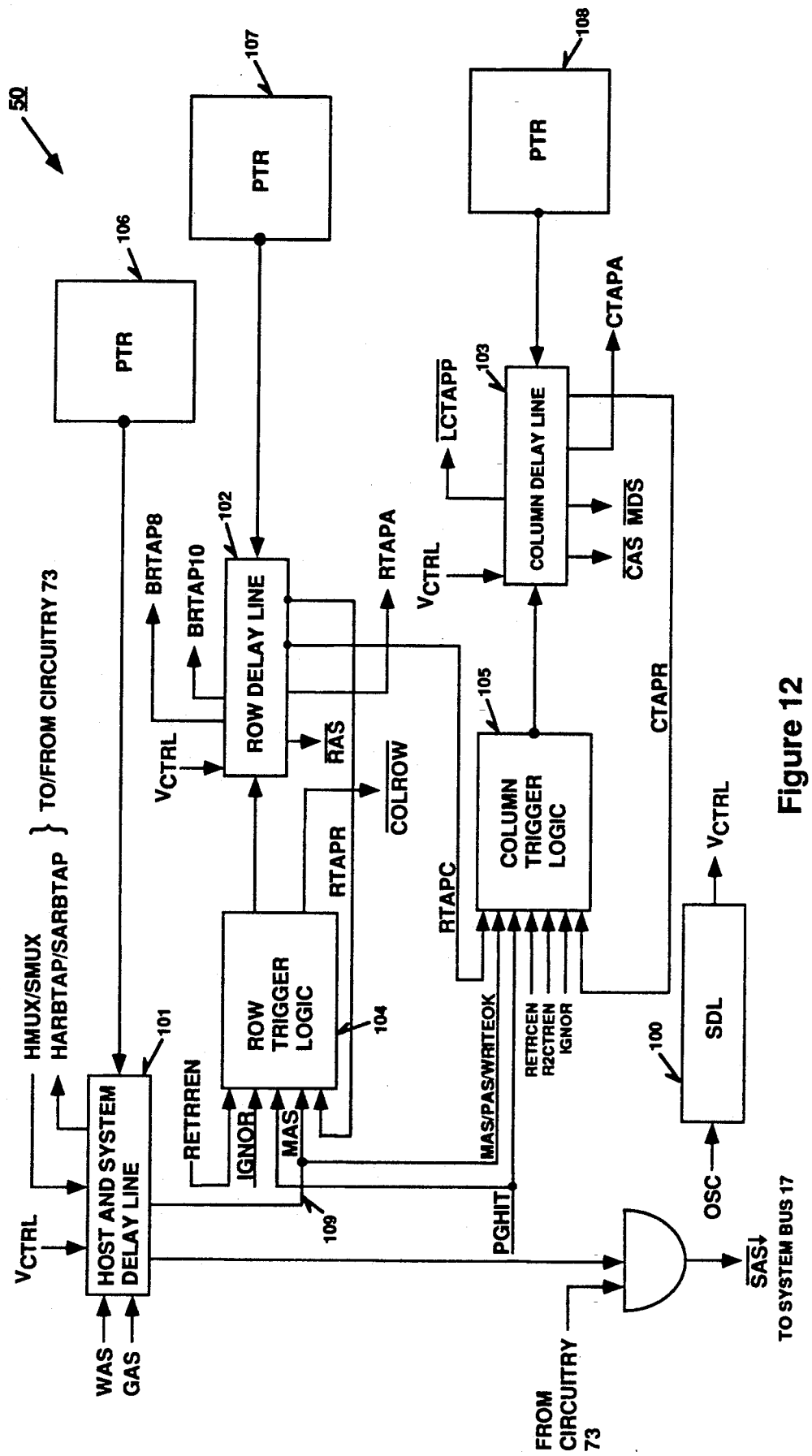
FIG. 12 illustrates in block diagram form the delay line circuitry of FIGS. 3 and 8, including a host and system delay line, a row delay line, and a column delay line.

In FIG. 12, delay line circuitry 50 includes a synchronous delay line ("SDL") 100. SDL 100 resides on the same substrate as other elements of delay line circuitry 50. SDL 100 receives an oscillation signal OSC which is an internal clock signal for delay line circuitry 50. The circuitry of SDL 100 is described in (1) U.S. Pat. No. 4,496,861, entitled "INTEGRATED CIRCUIT SYNCHRONOUS DELAY LINE," (2) U.S. Pat. No. 4,975,605, entitled SYNCHRONOUS DELAY LINE WITH AUTOMATIC RESET," and (3) U.S. Pat. No. 4,994,695, entitled "SYNCHRONOUS DELAY LINE WITH QUADRATURE CLOCK PHASES." The subject matter of these patents is hereby incorporated by reference.

In one embodiment, the oscillation signal OSC is a 40 MHz clock signal. In alternative embodiments, other frequencies of the oscillation signal OSC can be adopted.

SDL 100 generates a control voltage $V_{CTRL}$ at its output. The control voltage $V_{CTRL}$ signal varies with wafer processing, supply voltage variation and temperature variation within delay line circuitry 50 (FIG. 8). The $V_{CTRL}$ signal is then used to control other delay line elements in delay line circuitry 50 such that the $\overline{RAS}$, $\overline{CAS}$, and $\overline{MDS}$ memory timing signals generated by delay line circuitry 50 are insensitive to the variations from wafer processing, supply voltage and temperature.

Delay line circuitry 50 also includes a host and system delay line 101, a row delay line 102, and a column delay line 103. Delay lines 101-103 are not triggered by any clock signal. Delay lines 101-103 receive the $V_{CTRL}$ signal generated by SDL 100. Delay line 101 is triggered by the WAS or GAS signal. Host and system delay line 101 generates a delay signal corresponding to its input trigger signal WAS or GAS. Delay line 101 delays the arbitrated trigger signal WAS or GAS such that page hit detector 70 and row hit detector 71 can determine the cycle type of the current memory access before delay lines 102 and 103 are triggered. Also, the delay of the WAS or GAS signal by delay line 101 allows detectors 70 and 71 (FIG. 8) to determine if the current cycle is a host-to-system cycle in which delay lines 102-103 are not triggered at all. The function of host and system delay line 101 is to generate a delay from the start of a host or system cycle to the time when DRAM controller 20 has arbitrated the memory access request and determines the type of the current memory access cycle. If the current cycle is a host-to-system cycle, host and system delay line 101 generates the host to system delay. The host-to-system delay allows enough time for host address and status signals to propagate through DRAM controller 20 before DRAM controller 20 asserts the system address strobe signal $\overline{SAS}$ to system bus 17 (FIG. 1) via system interface 55 (FIG. 3).

Host and system delay line 101 receives an HMUX-/SMUX signal from memory and system slave arbitration circuitry 73 (FIG. 8). Delay line 101 includes a host delay line and a system delay line (see FIG. 25). The host delay line is triggered by the WAS signal, and the system delay line is triggered by the GAS signal. The HMUX/SMUX signal controls the outputs of either the host delay line or the system delay line. These outputs are the MAS and PAS signals.

Host and system delay line 101 outputs a HARBTAP/SARBTAP signal to arbitration circuitry 73 (FIG. 8).

The delayed WAS or GAS signal then becomes the input triggering signal MAS for row delay line 102 and input triggering signals MAS, PAS and WRITEOK for column delay line 103. When row delay line 102 and column delay line 103 receive the MAS and/or PAS signals, they generate the $\overline{RAS}$, $\overline{CAS}$, and $\overline{MDS}$ signals to access main memory 14 according to the type of the memory cycle.

Row delay line 102 generates the $\overline{RAS}$ signal and column delay line 103 generates the $\overline{CAS}$ and $\overline{MDS}$ signals. The sequence and timing of the $\overline{RAS}$, $\overline{CAS}$, and $\overline{MDS}$ signals are controlled by memory state circuitry 72. Row trigger logic 104 receives a RETRREN signal from memory state circuitry 72. Column trigger circuitry 105 receives a RETRCEN signal and a R2CTREN signal from memory state circuitry 72.

Row delay line 102 is triggered by row trigger logic 104. Row delay line 102 is only triggered for page miss, row miss and refresh cycles. Row delay line 102 also includes a retrigger path RTAPR. When qualified by a page miss cycle, the retrigger signal RTAPR causes delay line 102 to recycle. Row delay line 102 also provides timing signals BRTAP8 and BRTAP10 to memory state circuitry 72 to control the latching of states into memory state circuitry 72. The BRTAP8 signal is also employed for clearing the states of memory state circuit 72.

Column delay line 103 receives its trigger from column trigger logic 105. As can be seen from FIG. 12, column delay line 103 is triggered from one of three sources: (1) the column delay line trigger of the row delay line RTAPC signal for DRAM page misses or row misses; (2) directly from the delayed cycle trigger MAS and PAS of the host and system delay line 101 for DRAM page hits, or (3) from one of its own retrigger signals CTAPR for subsequent cycles of a burst access. Upon being triggered, column delay line 103 immediately asserts the $\overline{CAS}$ and $\overline{MDS}$ signals. Delay line 103 controls the rising edge of the $\overline{MDS}$ signal for data latching, the rising edge of $\overline{CAS}$, the column address hold time (the CTAPA signal) and the $\overline{CAS}$ cycle time for burst accesses. Delay line 103 also provides a timing signal LCTAPP for latching states into circuitry 72. The structure of delay lines 101-103 is described in more detail below, in conjunction with FIGS. 25-31.

Figure 22:
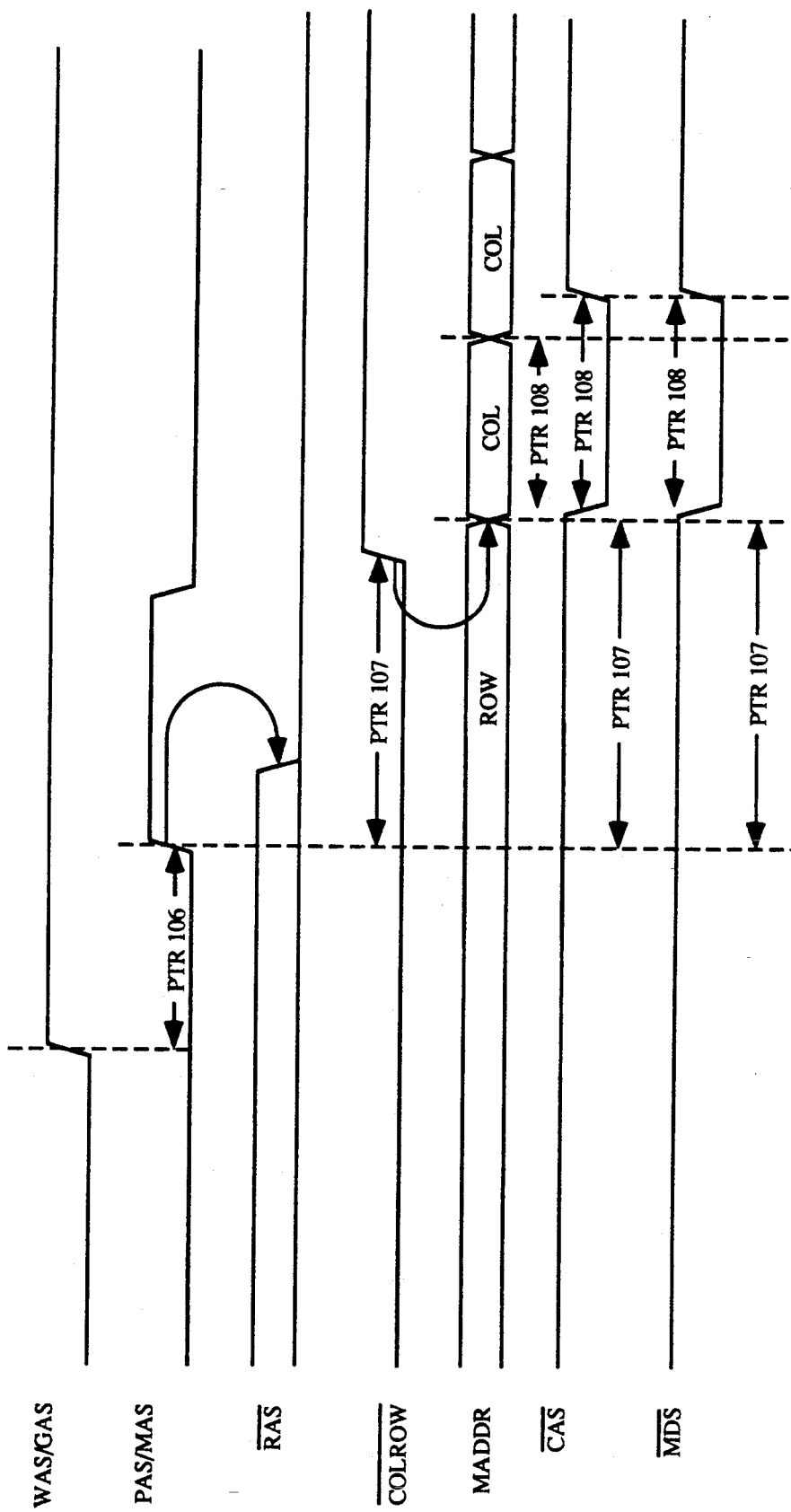
FIGS. 22-24 illustrate the use of the programmable timing registers in the delay line circuitry of FIG. 12 to control the timings of the memory timing control signals.
Figure 23:
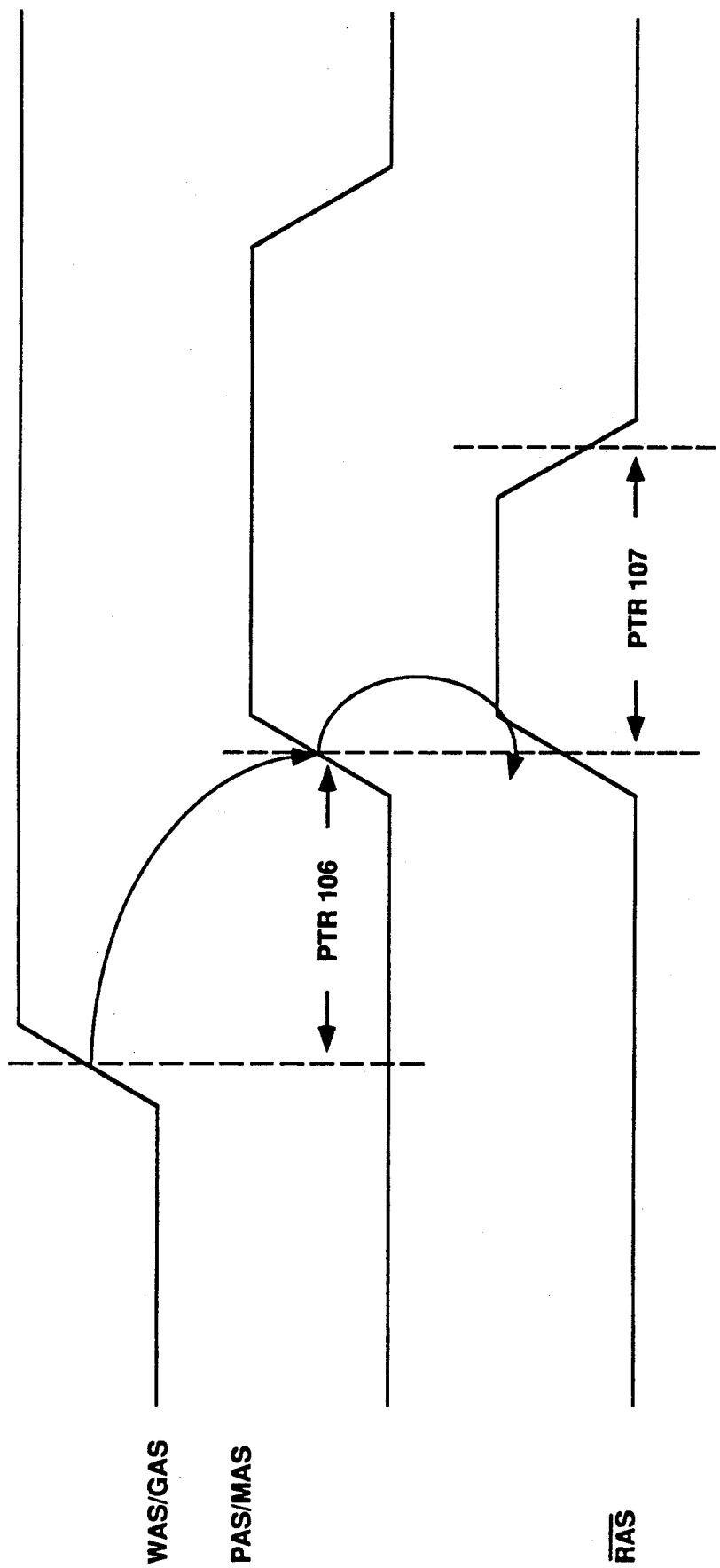
Figure 24:
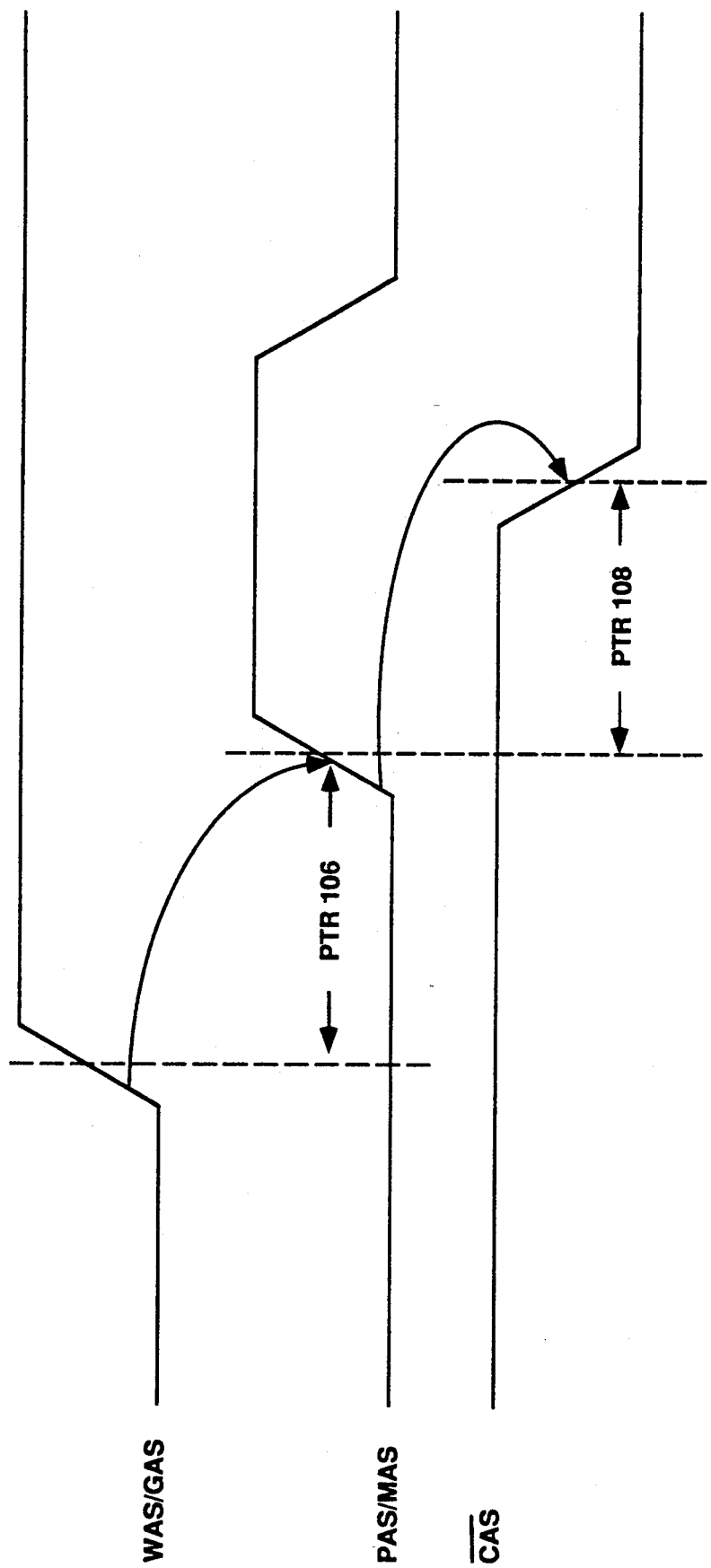

Each of delay lines 101-103 is also controlled by a programmable timing register ("PTR"). As can be seen from FIG. 12, delay line 101 is connected to a PTR 106. Delay line 102 is coupled to a PTR 107, and delay line 103 is coupled to a PTR 108. Each of PTRs 106-108 has a plurality of associated timing ranges which can be programmed to 2.5 ns resolution in the preferred embodiment. FIGS. 22-24 illustrate the functions of these PTRs 106-108. FIG. 22 illustrates the page hit cycle and the row miss cycle. FIG. 23 illustrates the page miss cycle and FIG. 24 illustrates the page hit write cycle.

As can be seen from FIGS. 22-24, PTRs 106-108 tailor the timings of the memory access timing signals $\overline{RAS}$, $\overline{CAS}$, and $\overline{MDS}$. As is known, DRAM memories may have different access times. For example, a DRAM may have an access time of 60 ns. As a further example, a DRAM may have an access time of 100 ns. The PTRs 106-108 are provided to facilitate the critical timings specific to each different speed of a DRAM. Through PTRs 106-108, DRAM parameters such as $\overline{RAS}$ precharge, $\overline{RAS}$ to $\overline{CAS}$ delay, etc. can be tailored to the required times for a specific DRAM with 2.5 ns resolution.

Referring back to FIG. 8, memory state circuitry 72 is employed to control delay line circuitry 50. Memory state circuitry 72 latches in the state of the current access cycle. Triggered by the timing signals from delay line circuitry 50 via line 78, memory state circuitry 72 controls the generation of the memory timing control signals $\overline{RAS}$, $\overline{CAS}$, and $\overline{MDS}$ from delay line circuitry 50. Memory state circuitry 72 receives its state input signal RFCNT17 from the internal DRAM refresh counter. The RFCNT17 signal indicates when the DRAM refresh is completed. Other input signals to state circuitry 72 include the $\overline{REFNOW}$ signal from memory and system slave arbitration state circuitry 73, a RWMIS signal from row hit detector 71, and a QMCAS signal derived from the output of page hit detector 70. The QMCAS signal, when combined with a timing signal from delay line circuitry 50 via line 78, indicates how many $\overline{CAS}$ pulses the current memory access needs. The $\overline{REFNOW}$ signal is the arbitrated refresh request, indicating that the current memory access is a refresh cycle.

As described above, a memory access cycle can be a page miss cycle, a row miss cycle, a page hit cycle, or a refresh cycle. Each cycle requires different $\overline{RAS}$ and $\overline{CAS}$ pulses. Memory state circuitry 72 latches in the current cycle state and uses it to control delay line circuitry 50 to generate the $\overline{RAS}$, $\overline{CAS}$, and $\overline{MDS}$ signals accordingly. The circuit of memory state circuitry 72 and its function is described below, in conjunction with FIGS. 13 through 18.

Figure 13:
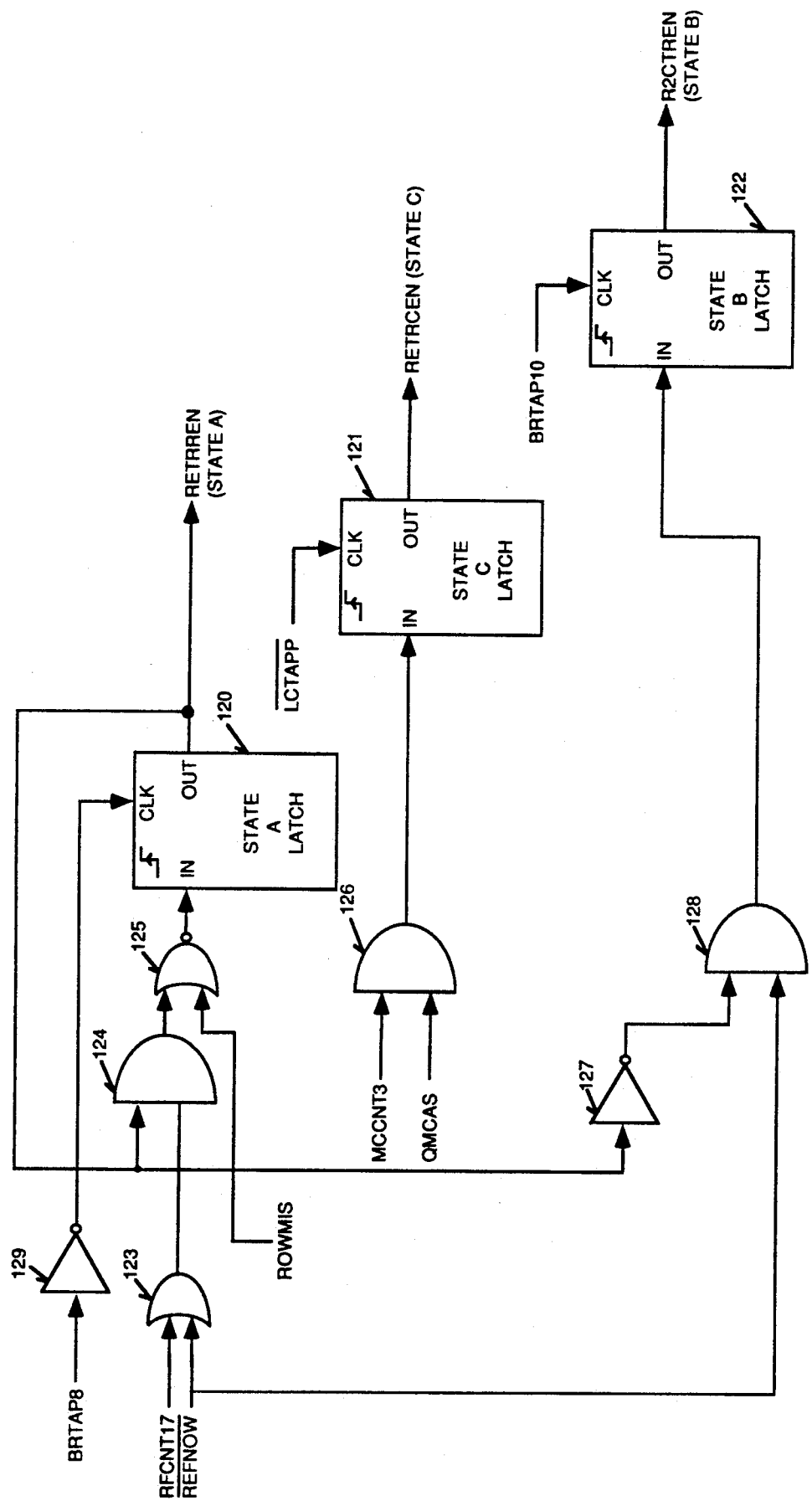
FIG. 13 illustrates in block diagram form the memory state circuitry of FIG. 8.

FIG. 13 illustrates one preferred embodiment of memory state circuitry 72 of FIG. 8. In FIG. 13, memory state circuitry 72 includes a state A latch 120, a state B latch 122, and state C latch 121. Latches 120-122 are clocked by the timing signals BRTAP8, BRTAP10, and LCTAPP from delay line circuitry 50. Latch 120 receives the RFCNT17 signal, the $\overline{REFNOW}$ signal, and the RWMIS signal via gates 123-125. Latch 120 is a state A latch which provides a RETRREN signal (STATE A) to row trigger logic 104 shown in FIG. 12. Latch 120 is clocked by the inverted BRTAP8 signal from row delay line 102.

Latch 122 is a STATE B latch which receives the $\overline{REFNOW}$ signal and the output of STATE A via inverter 127 and AND gate 128. Latch 122 is clocked by the BRTAP10 signal from row delay line 102. The output signal of latch 122 is R2CTREN (STATE B) signal which is applied to column trigger logic 105.

Latch 121 is a STATE C latch which receives the MCCNT3 and QMCAS signal via AND gate 126. The LCTAPP signal from column delay line 103 is the clock signal for latch 121. The output signal from latch 121 is the RETRCEN signal (STATE C) which is applied to column trigger logic 105.

Memory state circuitry 72 applies the RETRREN signal, the RETRCEN signal, and the R2CTREN signal to delay line circuitry 50 to control the generation of the $\overline{RAS}$ signal and the $\overline{CAS}$ signal in different memory access cycles. The STATE A signal (RETRREN), when high, indicates that the retrigger signal RTAPR for row delay line 102 can cause logic 104 to retrigger delay line 102. The STATE B signal (RETRCEN), when high, indicates that the row delay line trigger signal RTAPC for column delay line 103 can cause column trigger logic 105 to trigger column delay line 103. The STATE C signal (R2CTREN), when high, indicates that the retrigger signal CTAPR for column delay line 103 can cause column trigger logic 105 to retrigger column delay line 103.

Figure 14:
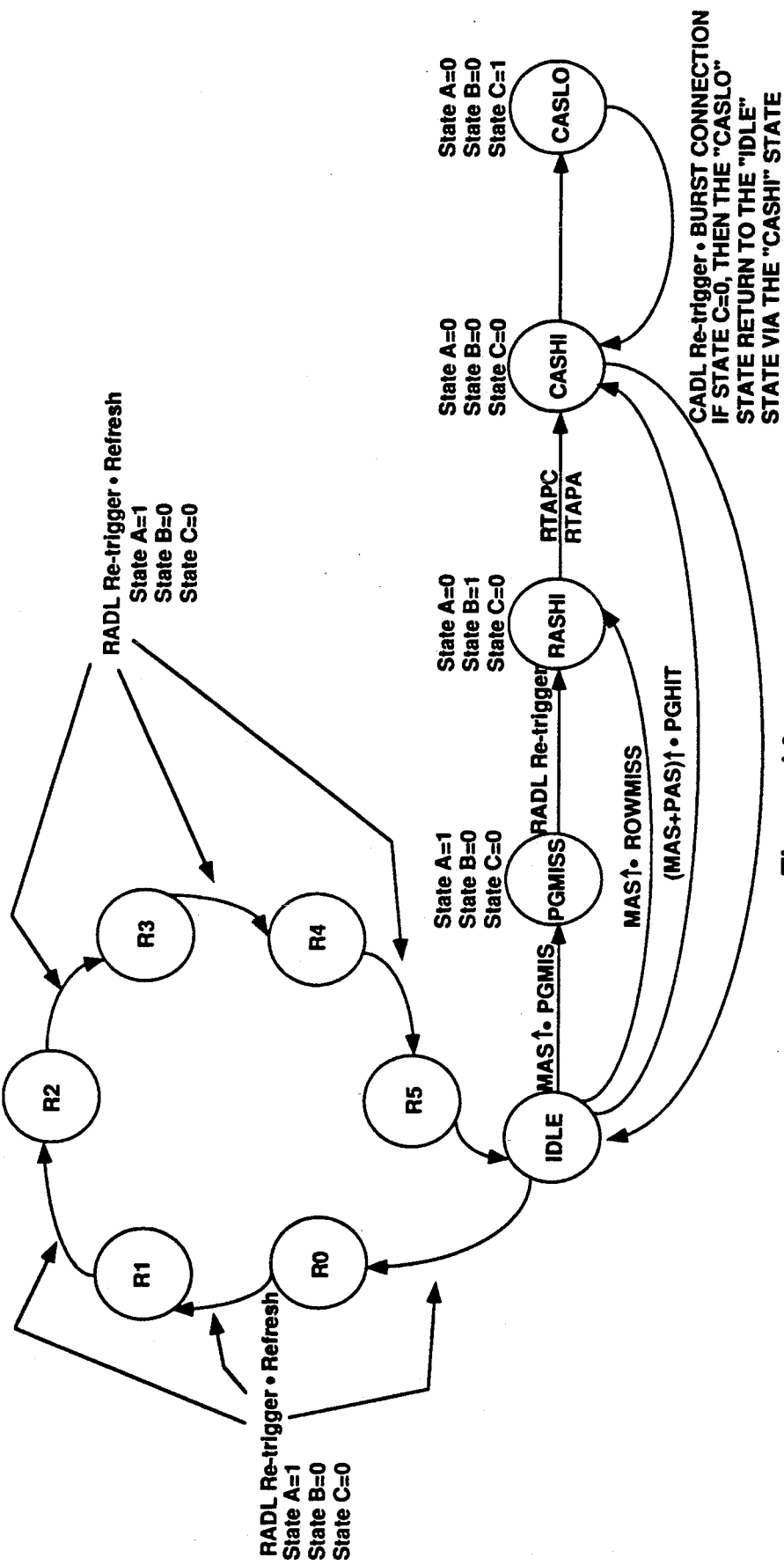
FIG. 14 illustrates the state diagram of the memory state circuitry.

FIG. 14 is the state diagram of memory state circuitry 72. FIGS. 15-18 illustrate the waveforms of the STATE A, STATE B, and STATE C signals. In FIG. 14, memory state circuitry 72 is first in an "IDLE" state.

Figure 15:
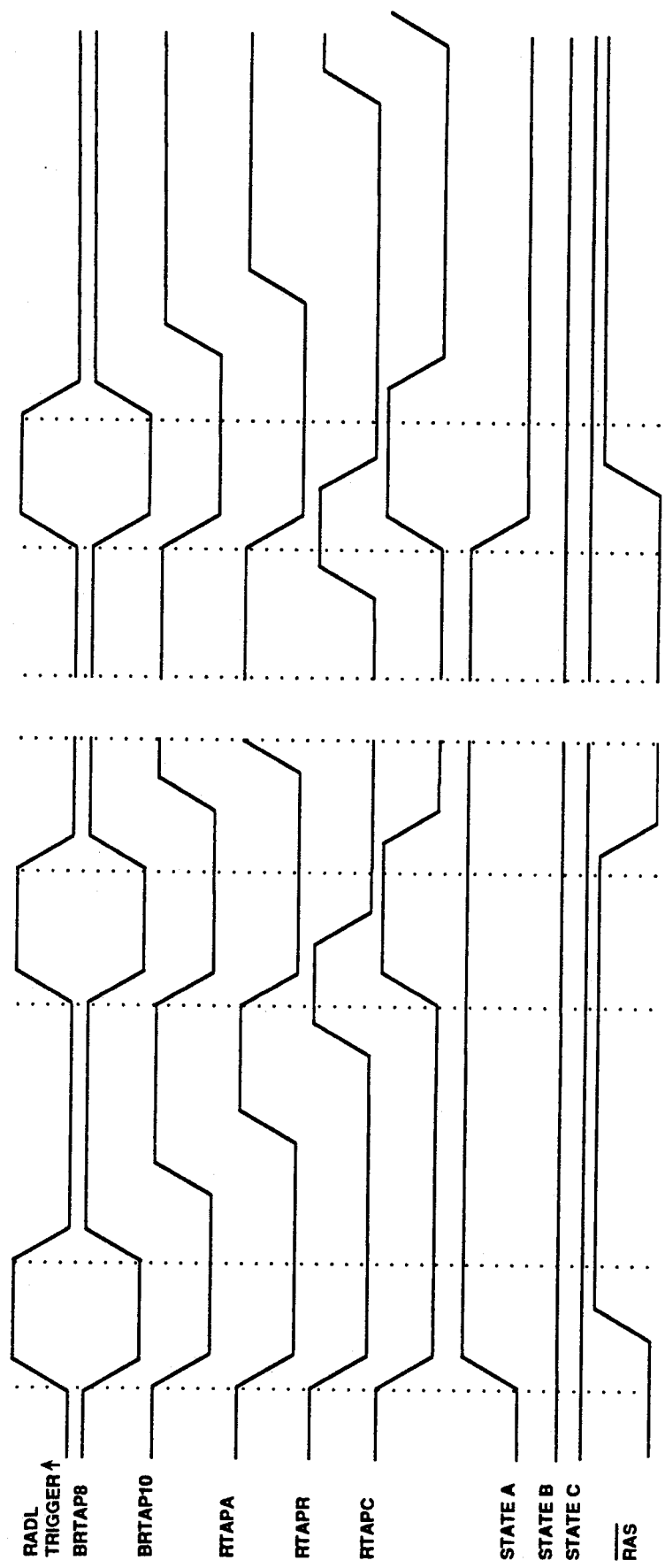
FIGS. 15-18 illustrate the signal waveforms in connection with the memory state circuitry in refresh, page miss, row miss, and page hit cycles.

When row delay line 102 and column delay line 103 of FIG. 12 receive the MAS and/or PAS triggering signals from host and system delay line 101, and if the input signal $\overline{\text{REFNOW}}$ for memory state circuitry 72 indicates that the current access is a refresh cycle, then memory state circuitry 72 goes through a number of refresh states "$R_0$" through "$R_5$" in which state A latch 120 generates a high output signal (STATE A=1) while state B and state C latches 122 and 121 are maintained at low outputs (STATE B=0, STATE C=0). The high state A signal allows row delay line 102 (FIG. 12) to be retriggered which causes memory state circuitry 72 to go through the refresh states $R_0$-$R_5$ in the refresh cycle until the cycle is over. The refresh states $R_0$ through $R_5$ are controlled by the RFCNT17 input signal from the refresh counter. When the refresh counter counts to the end of the refresh cycle, memory state circuitry 72 returns to the "IDLE" state from the "$R_5$" state. FIG. 15 illustrates the waveforms of the STATE A, STATE B, and STATE C signals in the refresh cycle.

Referring still to FIG. 14, when the current memory access is a page miss cycle, memory state circuitry 72 enters a page miss state ("PGMISS") when the MAS signal goes high. In the "PGMISS" state, memory state circuitry 72 applies the high STATE A, low STATE B, low STATE C signals to delay lines 102 and 103. As described above, the STATE A signal is to allow row delay line 102 to be retriggered with its RTAPR signal. When the RTAPR signal is received at row trigger logic 104, row trigger logic 104 retriggers delay line 102 with the STATE A signal being high. For page miss cycles, the $\overline{\text{RAS}}$ signal is immediately deasserted by $\overline{\text{RAS}}$ rising. The row/column multiplexing control signal $\overline{\text{COLROW}}$ from row trigger logic 104 (FIG. 12) and the column delay line trigger signal RTAPC (FIG. 12) are all gated off (e.g., inactive) on the first pass through delay line 102. This first pass is the row precharge time required in page miss cycles. The retrigger signal RTAPR is qualified by the high STATE A page miss indicator and causes row delay line 102 to be recycled.

The retriggering of row delay line 102 causes memory state circuitry 72 to enter a "RASHI" state in which the STATE B signal is high while the STATE A and STATE C signals are low. The retriggering also causes delay line 102 to be recycled. In the second pass, the $\overline{\text{RAS}}$ is activated by row delay line 102 (FIG. 12). The retrigger also causes the RTAPA signal to allow the row address to be set up onto main memory 14 (FIG. 1) with the proper row address setup time. The RTAPC signal then triggers column delay line 103. The trigger of column delay line 103 causes memory state circuitry 72 to enter a "CASHI" state. In the "CASHI" state, the STATE A, STATE B, and STATE C signals are all low. After column delay line 103 of FIG. 12 is triggered, column delay line 103 generates the $\overline{\text{CAS}}$ and $\overline{\text{MDS}}$ signals to main memory 14. Column delay line 103 also generates the $\overline{\text{LCTAPP}}$ signal which moves memory state circuitry 72 to the CASLO state. At the CASLO state, both the STATE A and STATE B signals are low. The STATE C signal is the indicator for the number of $\overline{\text{CAS}}$ pulses. If the STATE C signal is high, column delay line 103 is retriggered when circuitry 72 moves back to the "CASHI" state. If not, delay line 103 is not retriggered and returns to the "IDLE" state via the "CASHI" state. As can be seen from FIG. 13, the STATE C signal is determined by the MCCNT3 and QMCAS signals which decide how many $\overline{\text{CAS}}$ pulses the current memory access needs.

Figure 16:
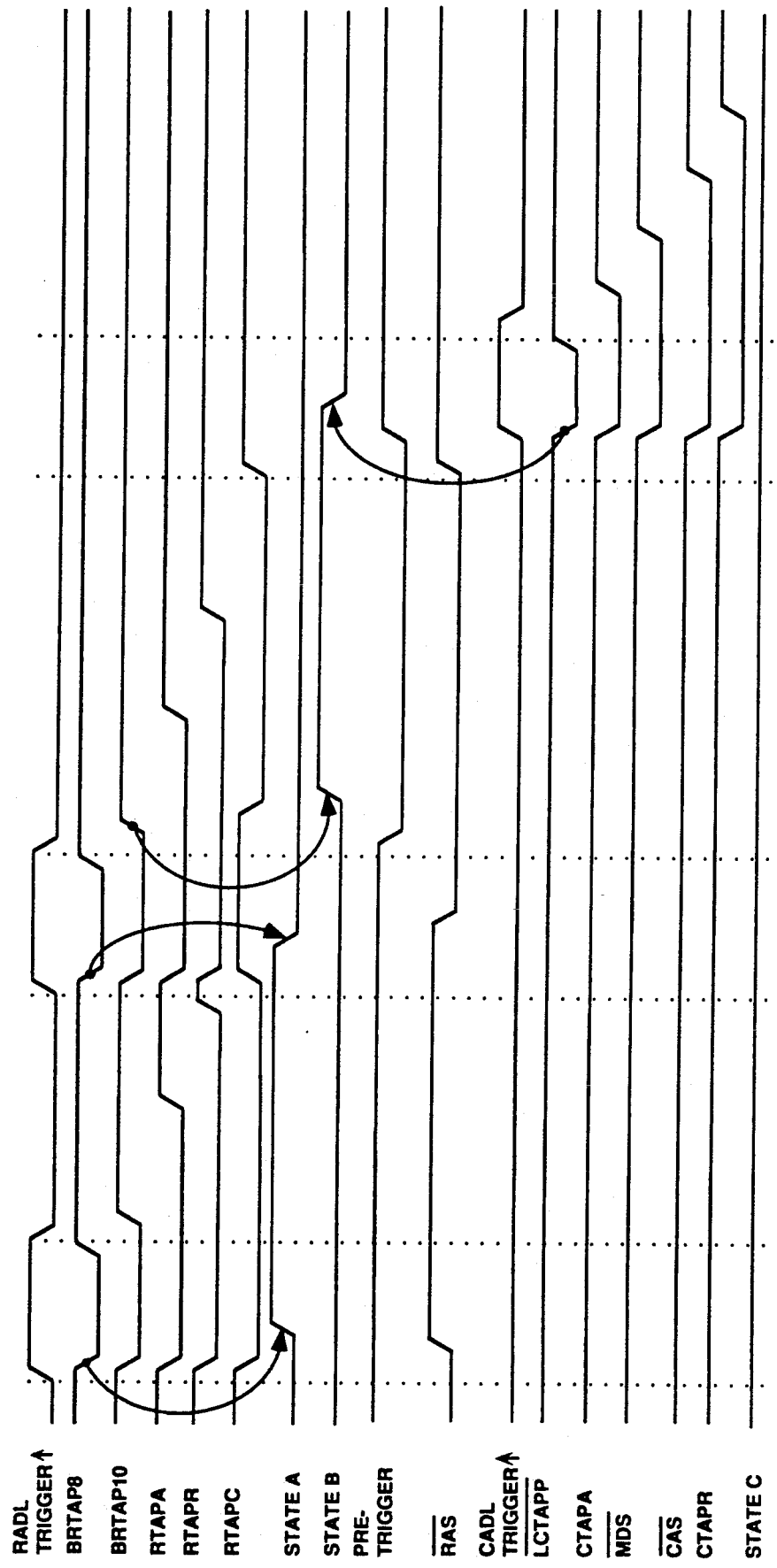

FIG. 16 illustrates the signal waveforms of the STATE A, STATE B, and STATE C signals in a memory page miss cycle. In FIG. 16, the $\overline{\text{CAS}}$ signal is shown not to be retriggered. The PRETRIGGER signal is a signal in column trigger logic 105 that is derived from the RTAPC signal.

Referring again to FIG. 14, when the current memory access is determined to be a row miss cycle, memory state circuitry 72 enters the "RASHI" state from the "IDLE" state after row delay line 102 is triggered. At the "RASHI" state, the STATE B signal is high and the STATE A and STATE C signals are low. This leads memory state circuitry 72 to the "CASH" state. The remaining states of the row miss cycle from the "RASHI" state are exactly like the ones of the page miss cycle as described above. As can be seen from FIG. 14, row delay line 102 is not retriggered in the row miss cycle.

Figure 17:
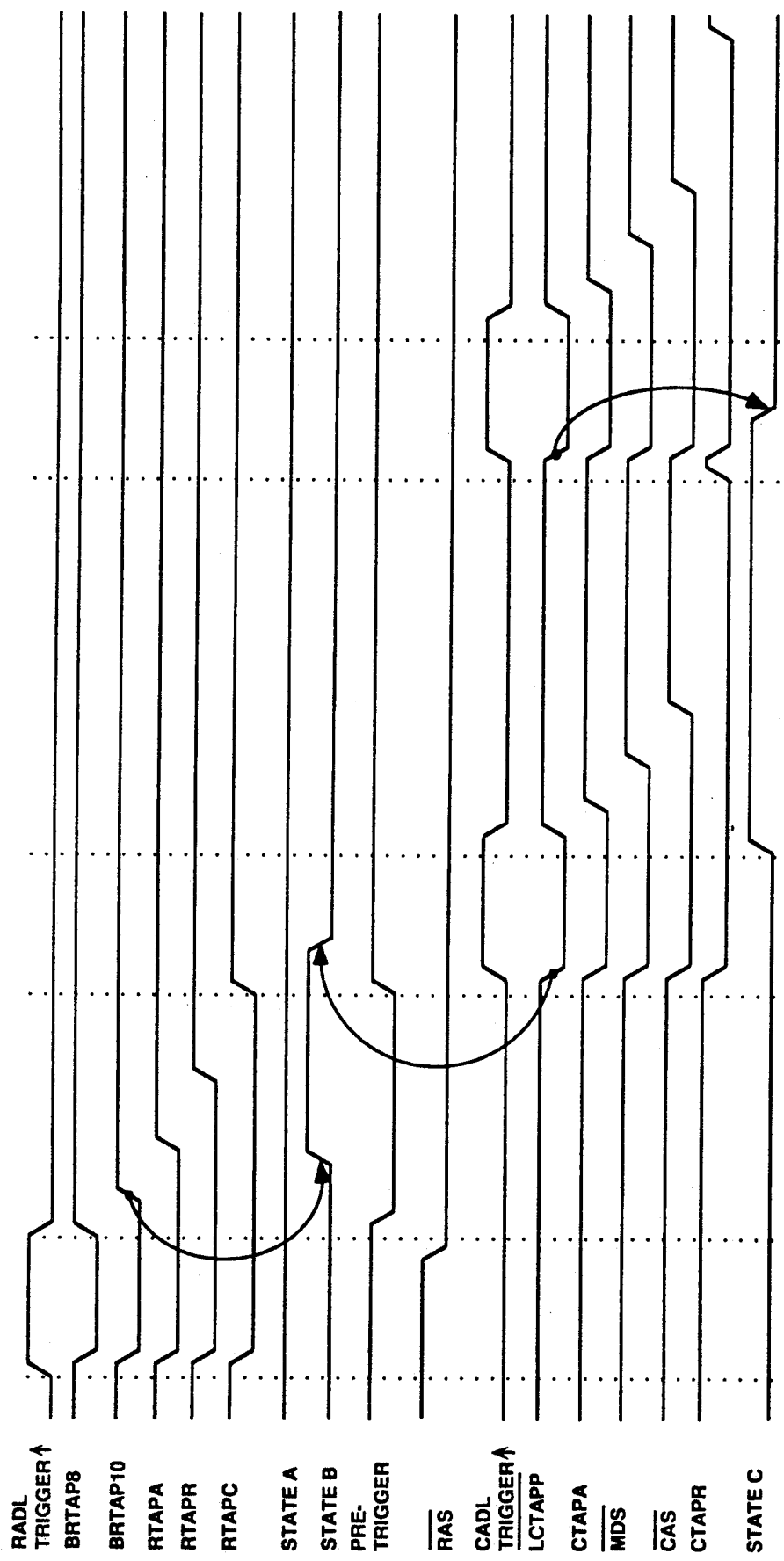

FIG. 17 illustrates the signal waveforms of the STATE A, STATE B, and STATE C signals in the row miss cycle.

Referring again to FIG. 14, when the current memory access is a page hit cycle, memory state circuitry 72 enters the "CASHI" state from the "IDLE" state. As can be seen from FIG. 14, row delay line 102 is not triggered at all and column delay line 103 is triggered by the PAS and MAS signals. The remaining states of the page hit cycle from the "CASHI" state on are exactly like the ones of the page miss cycle described above.

Figure 18:
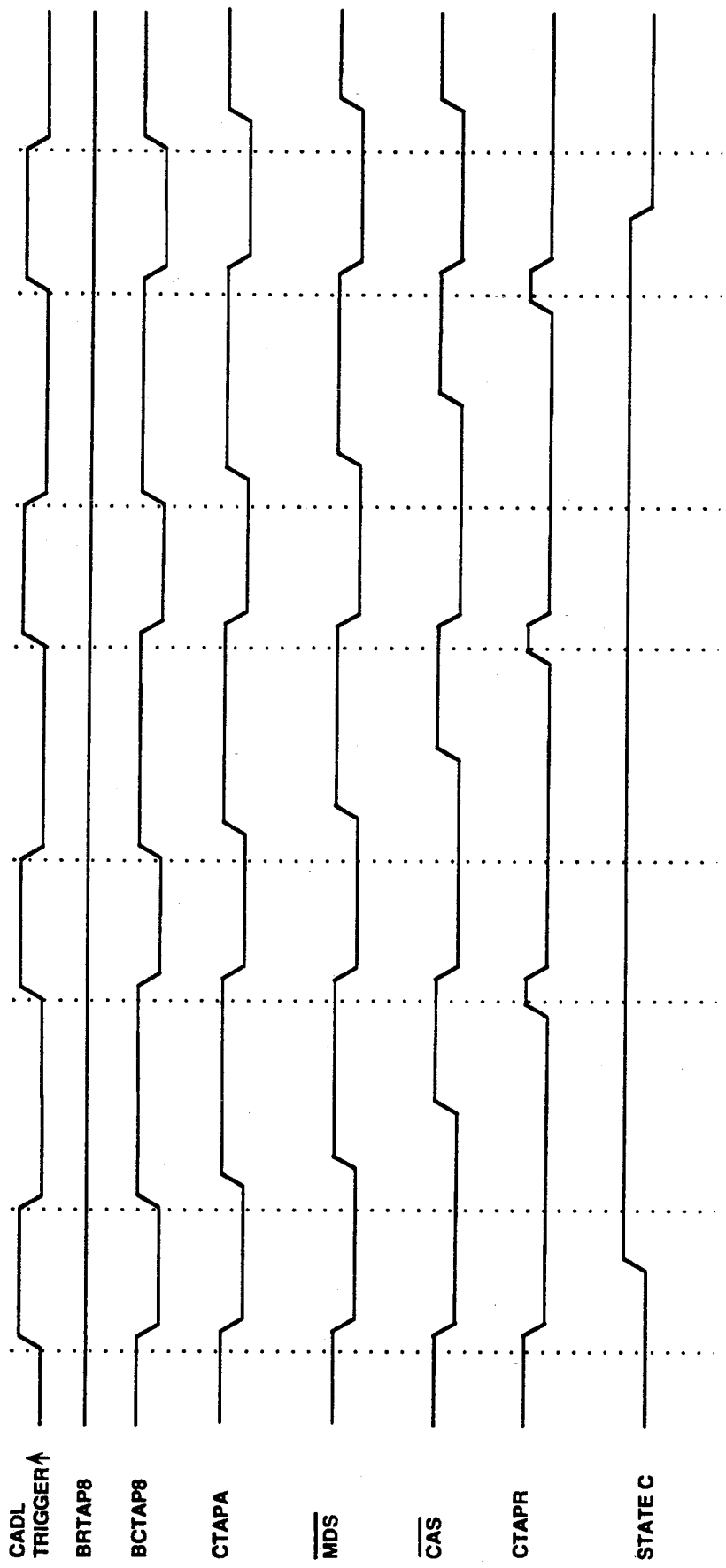

FIG. 18 illustrates the signal waveforms of the STATE A, STATE B, and STATE C signals of memory state circuitry 72 in the page hit cycle.

Referring back to FIG. 8, delay line circuitry 50 receives its trigger signals WAS and GAS from memory and system slave arbitration circuitry 73. Memory and system slave arbitration circuitry 73 controls the ownership of either main memory 14 or a system slave.

The memory ownership of main memory 14 is arbitrated by memory and slave arbitration circuitry 73. Arbitration circuitry 73 arbitrates the ownership between host and system masters and between internal requirements such as DRAM refresh.

To implement the arbitration process between the host, system, and refresh requirement and to communicate which is the current owner of main memory 14, four signals are employed. The HMREQ signal is driven by arbitration circuitry 73 to PST 12 (FIG. 1) to indicate to the CPU a system master request for ownership, or to indicate the need of a refresh cycle.

PST 12 asserts the HMACK signal in response to the HMREQ signal from arbitration circuitry 73 if the CPU does not currently own DRAM controller 20. PST 12 relinquishes main memory control to DRAM controller 20 by asserting the HMACK signal. From the asserted HMACK signal, arbitration circuitry 73 knows that the host CPU has given control to controller 20 to run either refresh or system cycles to main memory 14. Control remains in possession of DRAM controller 20 until circuitry 73 deasserts the HMREQ signal to PST 12. Arbitration circuitry 73 deasserts the HMREQ signal after the cycle is completed and the CPU has a pending cycle (the $\overline{\text{HAS}}$ is active). In essence, arbitration circuitry 73 is under control of PST 12 and controller 20 may only run system-to-memory or refresh cycles when the host CPU has released main memory ownership.

Figure 20:
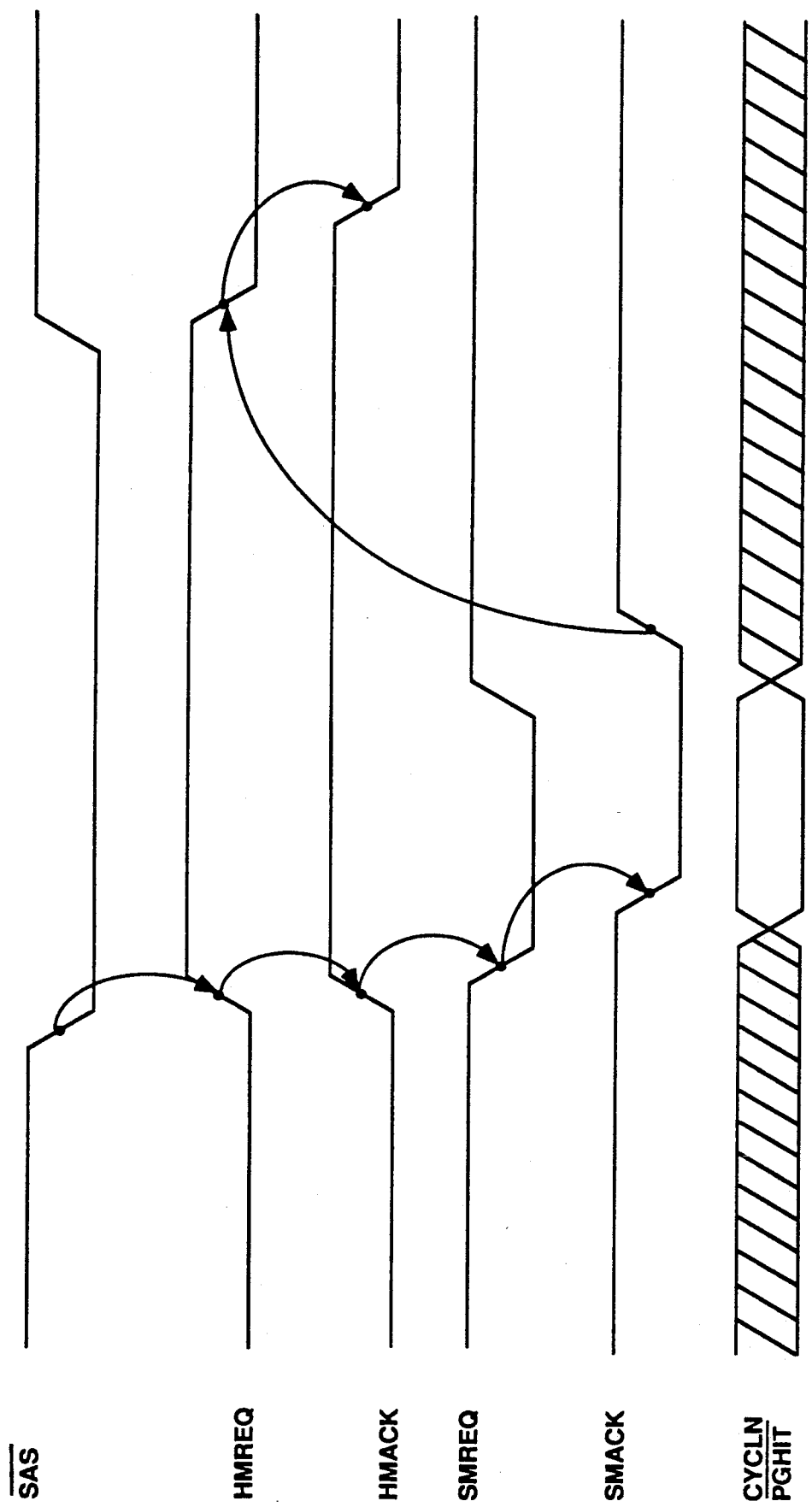
FIG. 20 illustrates the waveforms of the DRAM controller in a system cycle.

FIG. 20 illustrates the arbitration process for a system cycle. In FIG. 20, the falling edge of the $\overline{SAS}$ signal to memory and system slave arbitration circuitry 73 indicates the request for memory ownership. Arbitration circuitry 73 then generates the HMREQ signal to PST 12 to request the memory ownership. If the CPU does not have any host cycle pending, the CPU releases memory ownership by generating the HMACK signal to circuitry 73. When the memory ownership has been obtained, arbitration circuitry 73 deasserts the SMREQ signal to the system master. The system master responds with the SMACK signal deasserted to indicate its release of memory ownership. When arbitration circuitry 73 receives the falling edge of the SMACK signal, arbitration circuitry 73 allows the $\overline{SAS}$ signal to become the GAS signal which then triggers delay line circuitry 50. When the system cycle is complete, arbitration circuitry 73 receives an asserted SMACK signal. Arbitration circuitry 73 then deasserts the HMREQ signal which causes the HMACK signal to be deasserted.

Referring back to FIG. 8, memory and system slave arbitration circuitry 73 includes a system slave arbiter (not shown). System slave arbiter is employed to decide if the CPU should own system bus 17 in a host-to-system cycle. If the CPU is entitled to own system bus 17 via DRAM controller 20, system slave arbiter controls AND gate 82 to apply the $\overline{SAS}$ signal to system bus controller 15 via system interface 55 of FIG. 3. In this case, the state in the system slaver arbiter is latched in a latch 83 under the WAS trigger signal (The WAS signal is the arbitrated signal of the $\overline{HAS}$ signal). Delay line circuitry 50 then generates the TAS signal which is the delayed signal of the WAS signal. The TAS signal then is gated out by the state of the arbiter latched in latch 83 to become the $\overline{SAS}$ signal. The delay of the TAS signal to the WAS signal generated by delay line circuitry 50 ensures sufficient time for the system slave arbiter to determine if the CPU is entitled to own system bus 17 and to latch its state to AND gate 82.

The system slave arbiter receives the SHOLD signal from bus controller 15. The SHOLD signal indicates whether system bus activity is occurring. If the SHOLD signal is deasserted, no system master owns bus 17.

Figure 21:
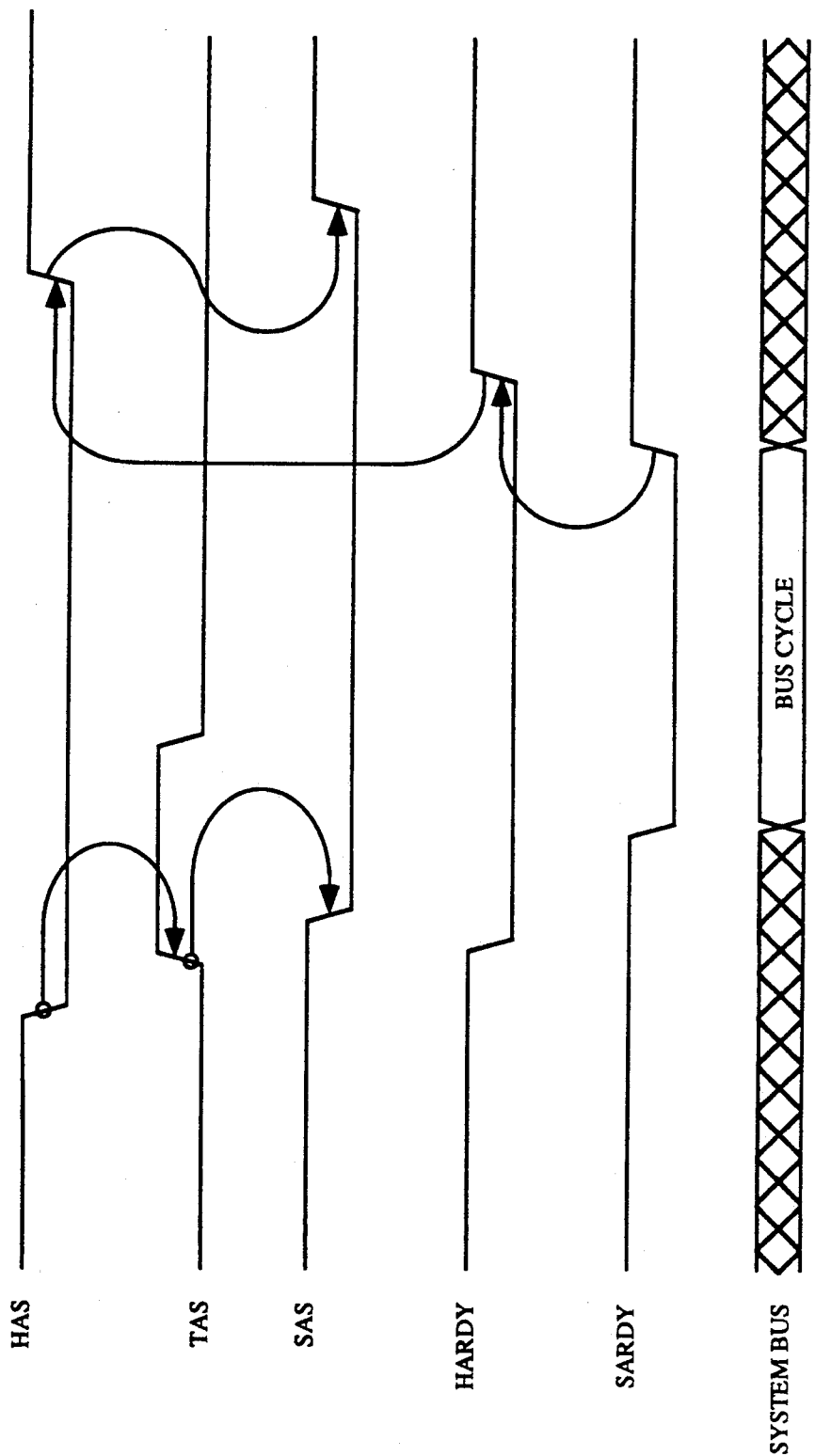
FIG. 21 illustrates the signal waveforms of the DRAM controller in a host-to-system cycle.

Once the system arbiter determines that the CPU has control of system bus 17, the $\overline{SAS}$ signal is asserted to bus controller 15 (FIG. 1) which causes the system cycle to start. Bus controller 15 then generates the appropriate system bus cycle, and then deasserts the SARDY signal (FIG. 3) to DRAM controller 20. DRAM controller 20 learns the system bus cycle is completed when it detects the rising edge of the SARDY signal, which in turn generates the rising edge of HARDY signal to PST 12. Upon receiving the deasserted HARDY signal, PST 12 removes the $\overline{HAS}$ signal causing the $\overline{SAS}$ to be deasserted and ending the cycle. FIG. 21 illustrates the signal waveforms of the $\overline{HAS}$, $\overline{SAS}$, HARDY, and SARDY signals in the host-to-system cycle.

If the system slave arbiter determines via the SHLDA signal that the CPU is not entitled to system bus 17 because of current bus activity, the arbiter then watches the system bus activity and moves the state of the system slave arbitor to a state where nobody owns system bus 17. The arbiter then can obtain the ownership of system bus 17 for the CPU.

Figure 19:
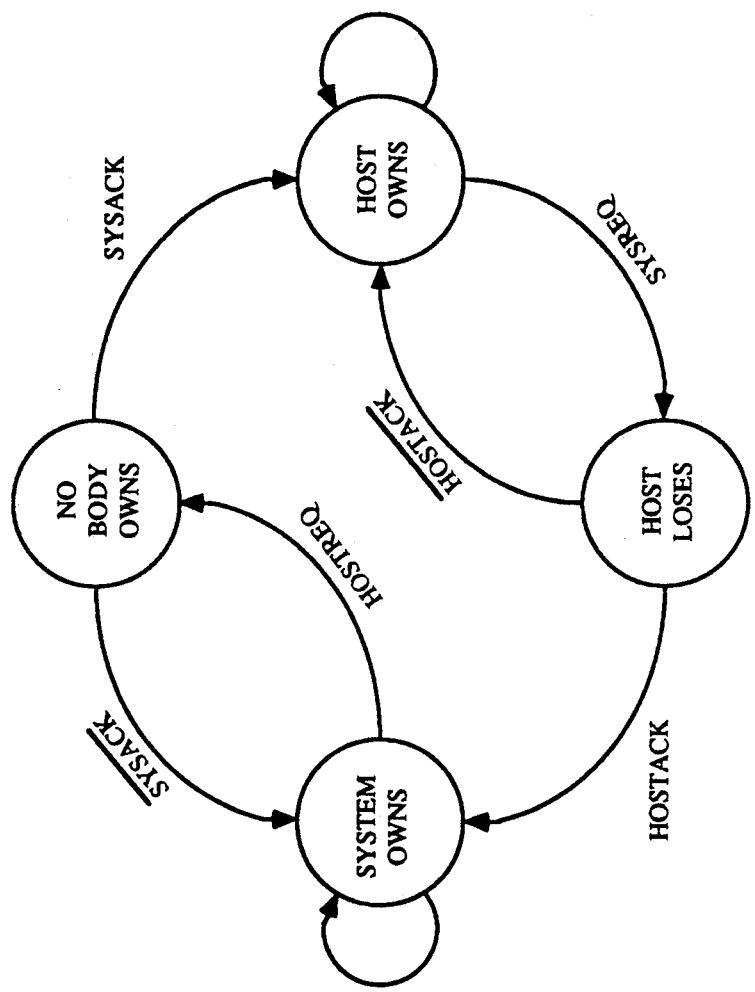
FIG. 19 is a state diagram of the system slave arbitration circuitry of FIG. 8 in terms of system slave arbitration in a host-to-system cycle.

FIG. 19 illustrates the state diagram of the system arbiter. In FIG. 19, the "HOST OWNS" state indicates the state where the CPU can own system bus 17 and assert the $\overline{SAS}$ signal to system bus controller 15. When a system master requests bus ownership (e.g., SYSREQ), the CPU loses ownership and the arbiter moves to the "HOST LOSES" state. The system master then can acquire bus ownership and the arbiter moves to the "SYSTEM OWNS" state in which the system master owns system bus 17. The arbiter is then moved to the "NO BODY OWNS" state by a host request HOSTREQ when the system bus activity is complete. The CPU then obtains the bus ownership from the "NO BODY OWNS" state. The arbiter returns to the "HOST OWNS" state when the CPU owns the system bus.

Figure 25:
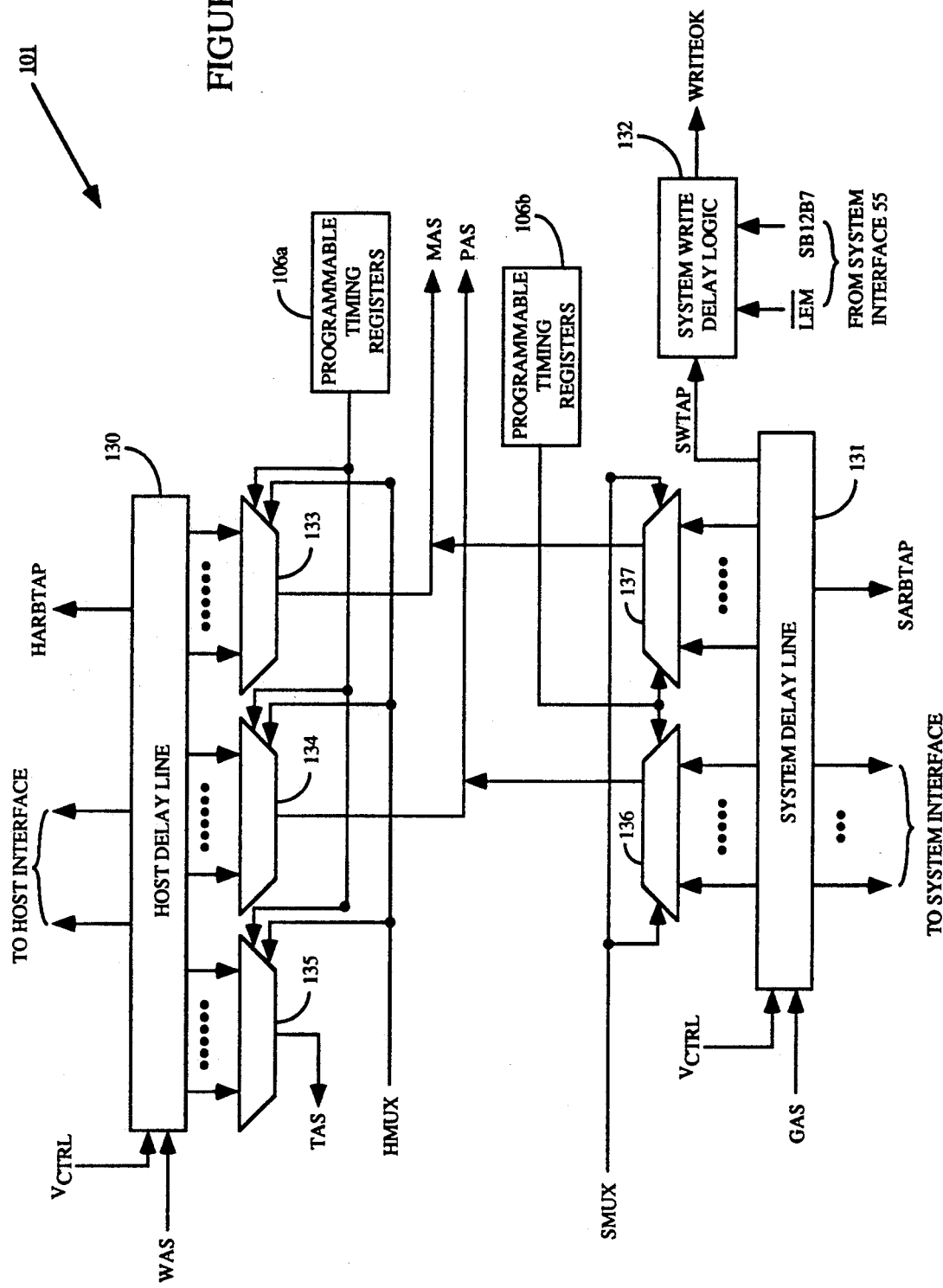
FIG. 25 is a block diagram of the host and system delay line of FIG. 12, including a host delay line and a system delay line.

FIG. 25 illustrates in block diagram form the structure of host and system delay line 101 of FIG. 12. In FIG. 25, host and system delay line 101 includes a host delay line 130 and a system delay line 131. The structure of host and system delay lines 130 and 131 is described in more detail below, in connection with FIG. 29.

Both delay lines 130 and 131 receive the $V_{CTRL}$ signal generated by SDL 100 (FIG. 12) and provide tap signals to multiplexers 133-135 and 136-137, respectively. Multiplexers 133-135 are controlled by PTR 106a and the HMUX signal from arbitration circuitry 73. Multiplexers 136-137 are controlled by PTR 106b and the SMUX signal from arbitration circuitry 73. Multiplexer 135 provides the TAS signal. PTRs 106a and 106b control the timings of the MAS and PAS signals by controlling multiplexers 133-137 to select their tap signals. The HMUX and SMUX signals are employed to control the coupling of multiplexer 133-135 and multiplexers 134-137, respectively. When the WAS signal triggers host delay line 130, the HMUX signal opens multiplexers 133-135. When the GAS signal triggers system delay line 131, the SMUX signal opens multiplexers 136-137.

System delay line 131 also includes an output tap signal SWTAP. The SWTAP signal is applied to system write delay logic 132 which generates a WRITEOK signal. the WRITEOK signal is then applied to column trigger logic 105 for column delay line 103 (FIG. 12). System write delay logic 132 also receives a $\overline{LEM}$ signal and a SB12B7 signal from system interface 55.

The WRITEOK signal is generated when the current system cycle for memory is a write cycle. The function of the WRITEOK signal is to make sure the data to be written into main memory 14 is valid at the falling edge of the $\overline{CAS}$ signal. The WRITEOK signal delays the generation of the $\overline{CAS}$ signal until the data is set up for the write.

The output MAS and PAS signals are delayed signals from either the WAS signal or the GAS signal with different delays. The MAS signal occurs before the PAS signal. The PAS signal is used as the trigger for a page hit write cycle, in which the generation of the $\overline{CAS}$ signal is further delayed until the data has been set up. If the cycle is not a page hit write, the trigger signal to row delay line 102 and column delay line 103 is the MAS signal.

Figure 26:
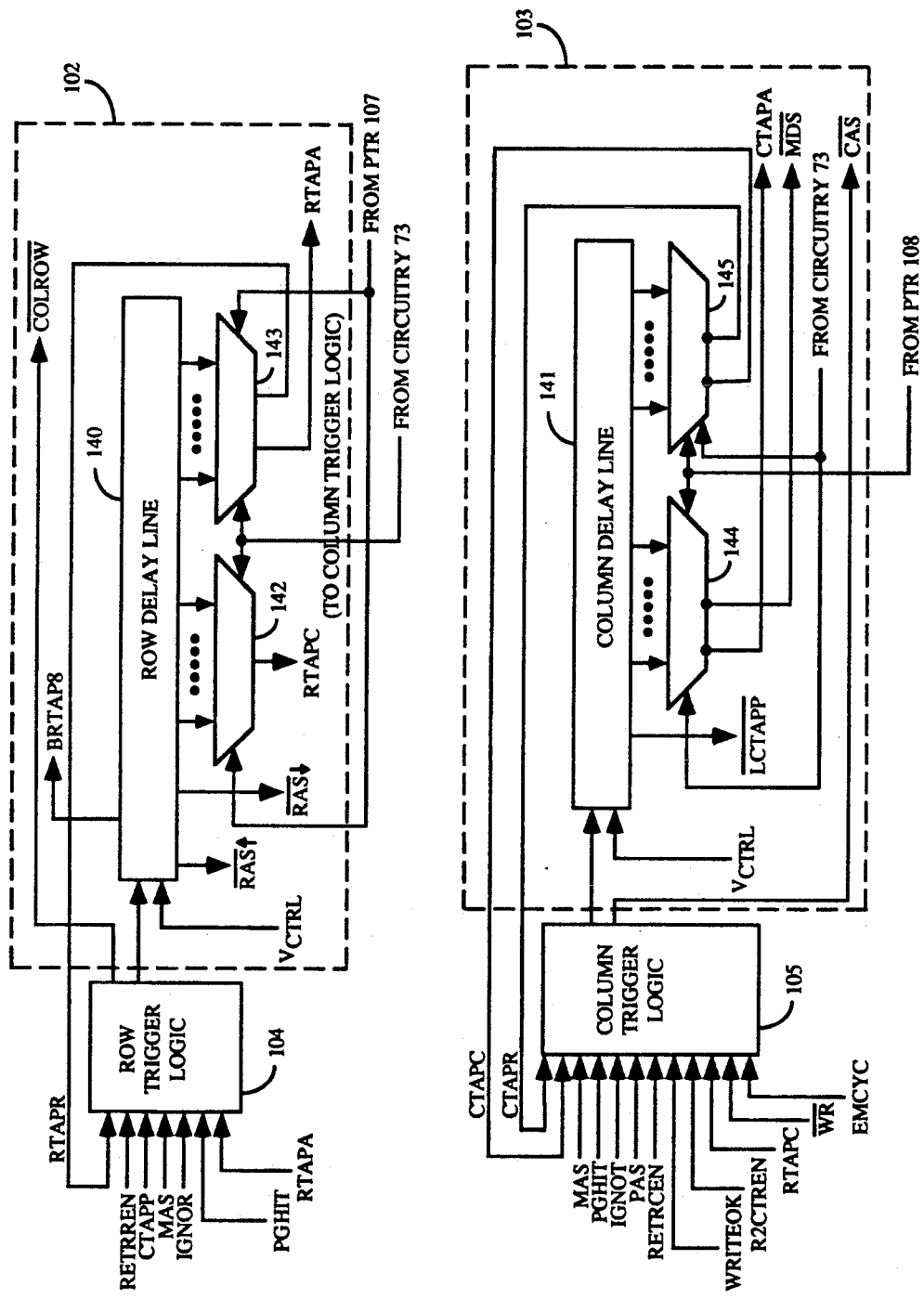
FIG. 26 illustrates in block diagram form the row delay line and the column delay line of FIG. 12.

FIG. 26 illustrates in block diagram form the structure of row delay line 102 and column delay line 103. In FIG. 26, multiplexers 142-145 are controlled by PTRs 107 and 108 and by arbitration circuitry 73. As can be seen from FIG. 26, the $\overline{RAS}$ signal is derived from two tap signals, one for the rising edge and one for the falling edge. The $\overline{CAS}$ signal is applied from column trigger logic 105.

The EMCYC signal applied to logic 105 is from system interface 55 to indicate that the current access is an EISA master cycle and attention should be paid to the WRITEOK signal which indicates if a write operation occurs. The $\overline{WR}$ is a write/read indicator of the current memory cycle.

Row trigger logic 104 only receives the MAS signal. Column trigger logic 105 receives the MAS and PAS signals. When a page hit write cycle is active, row delay line 102 is not triggered and column delay line 103 is triggered with the PAS signal.

Figure 27:
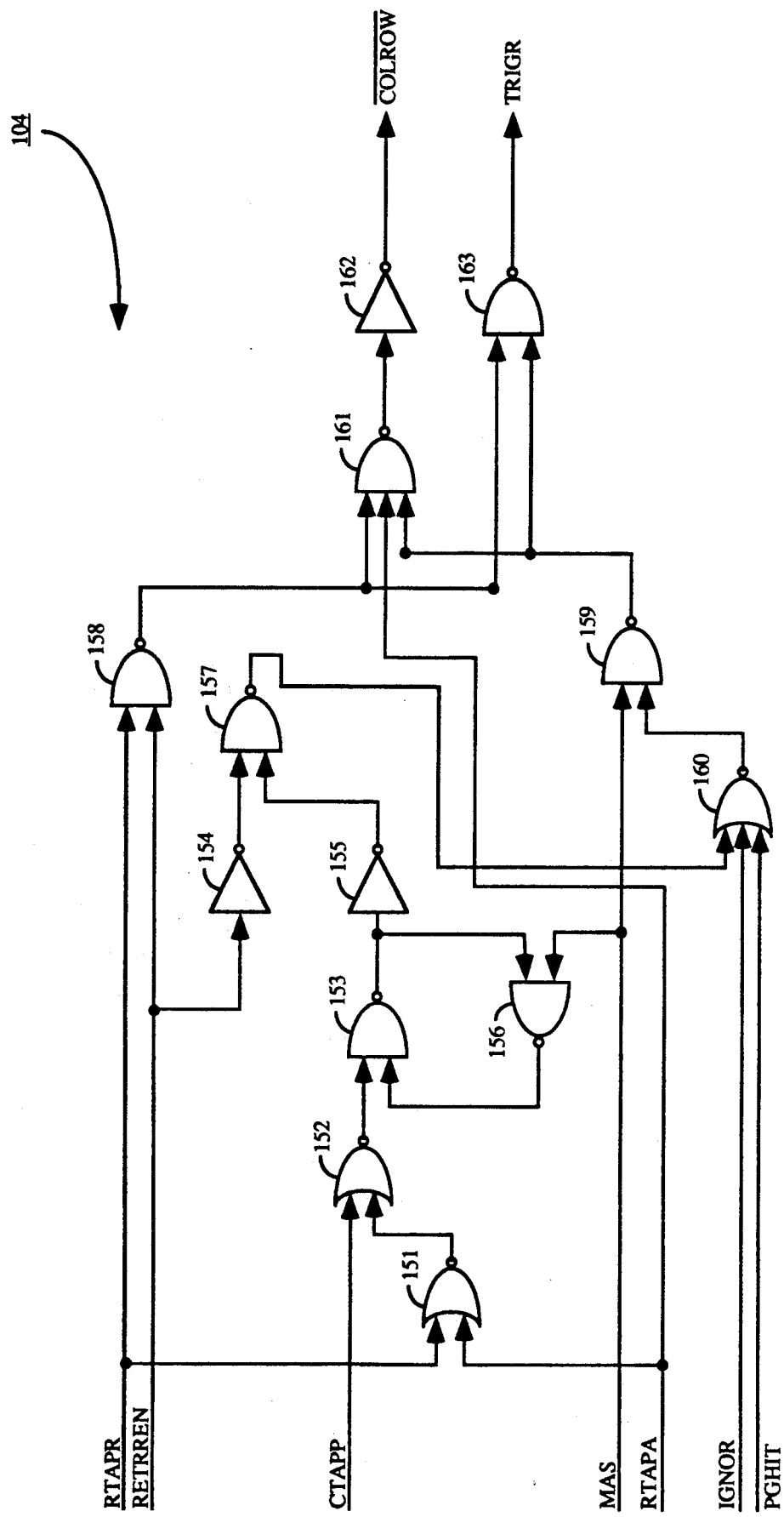
FIG. 27 is the circuitry diagram of the row trigger logic of FIG. 26.

FIG. 27 illustrates the circuitry of row trigger logic 104 of FIG. 26. The TRIGR signal is the trigger signal for row delay line 140 of FIG. 26. In FIG. 27, the TRIGR signal is the trigger signal to row delay line 140. The $\overline{COLROW}$ signal is applied to an address multiplexer (not shown) to control the latching of the row address at the $\overline{RAS}$ signal and the column address at the $\overline{CAS}$ signal to main memory 14 (FIG. 1). The IGNOR signal is from memory and system slave arbitration circuitry 73 of FIG. 8. The PGHIT signal is received from page hit detector 70 of FIG. 8. As can be seen from FIG. 27, logic 104 only receives the MAS triggering signal.

Figure 28:
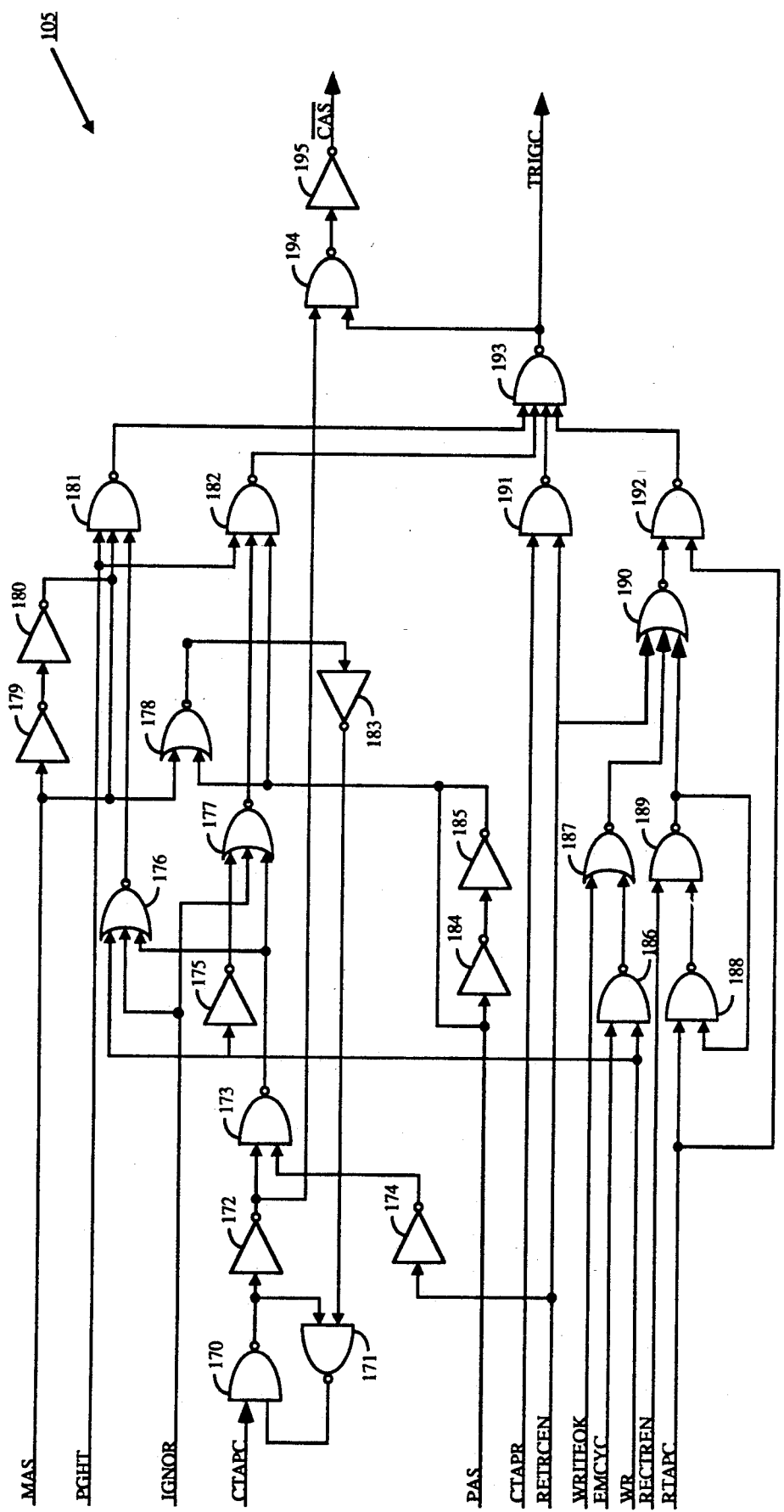
FIG. 28 shows the circuitry of the column trigger logic of FIG. 26.

FIG. 28 illustrates the circuitry of column trigger logic 105 of FIG. 26. In FIG. 28, the TRIGC signal is the trigger signal for delay line 141. The $\overline{CAS}$ signal is also derived from column trigger logic 105.

As can be seen from FIG. 28, inverters 179 and 180 act together as a sustainer that eliminates any glitch occurred to the MAS signal when multiplexers 133 and/or 137 (FIG. 25) tri-states the MAS signal. Similarly, inverters 184 and 185 act together as a sustainer that eliminates any glitch occurred to the PAS signal when the PAS signal from multiplexers 134 and 136 (FIG. 25) is tri-stated.

Figure 29:
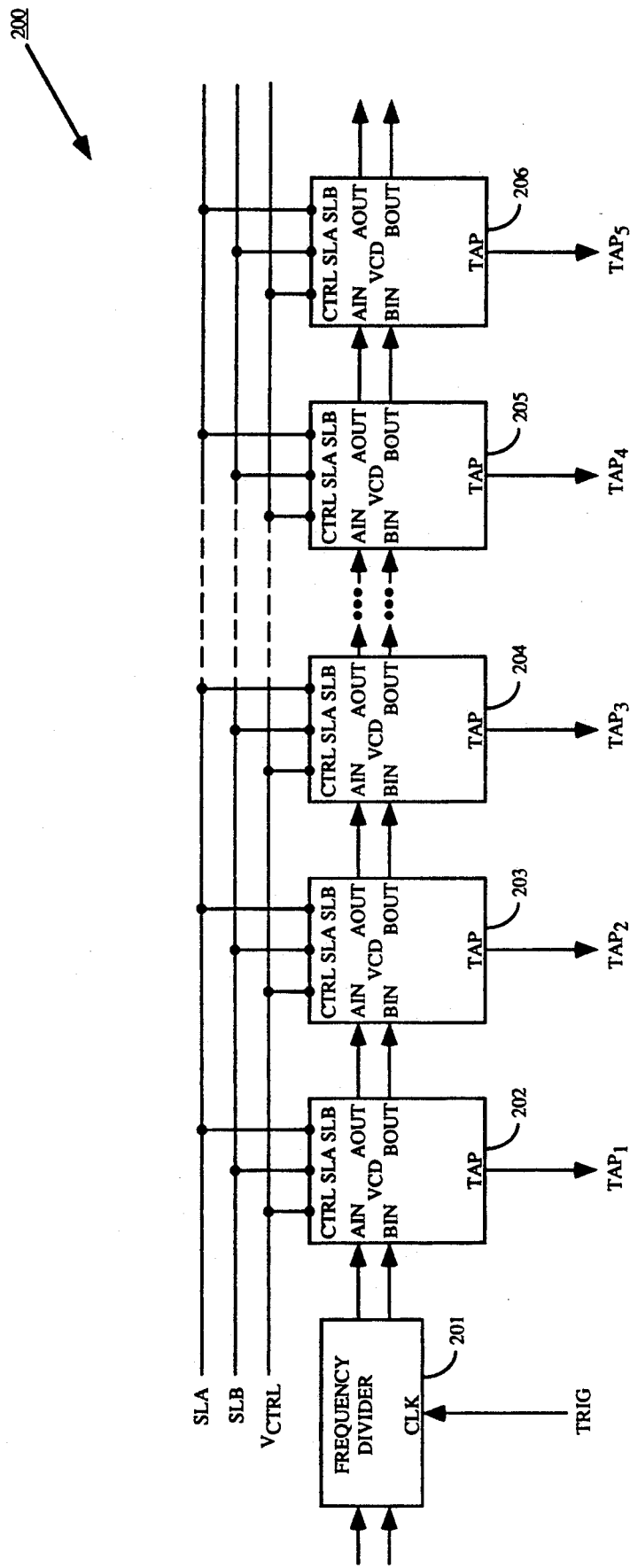
FIG. 29 illustrates the structure of a delay line.

FIG. 29 illustrates in block diagram form the structure of a delay line 200. Delay line 200 can be used for host delay line 130 and system delay line 131 (FIG. 25) and for delay lines 140 and 141 (FIG. 26). Elements 202-206 are voltage controlled delay stages. The structure and the function of delay line 200 have been described in the above-identified patents, the subject matter of which has been incorporated by reference.

Figure 30:
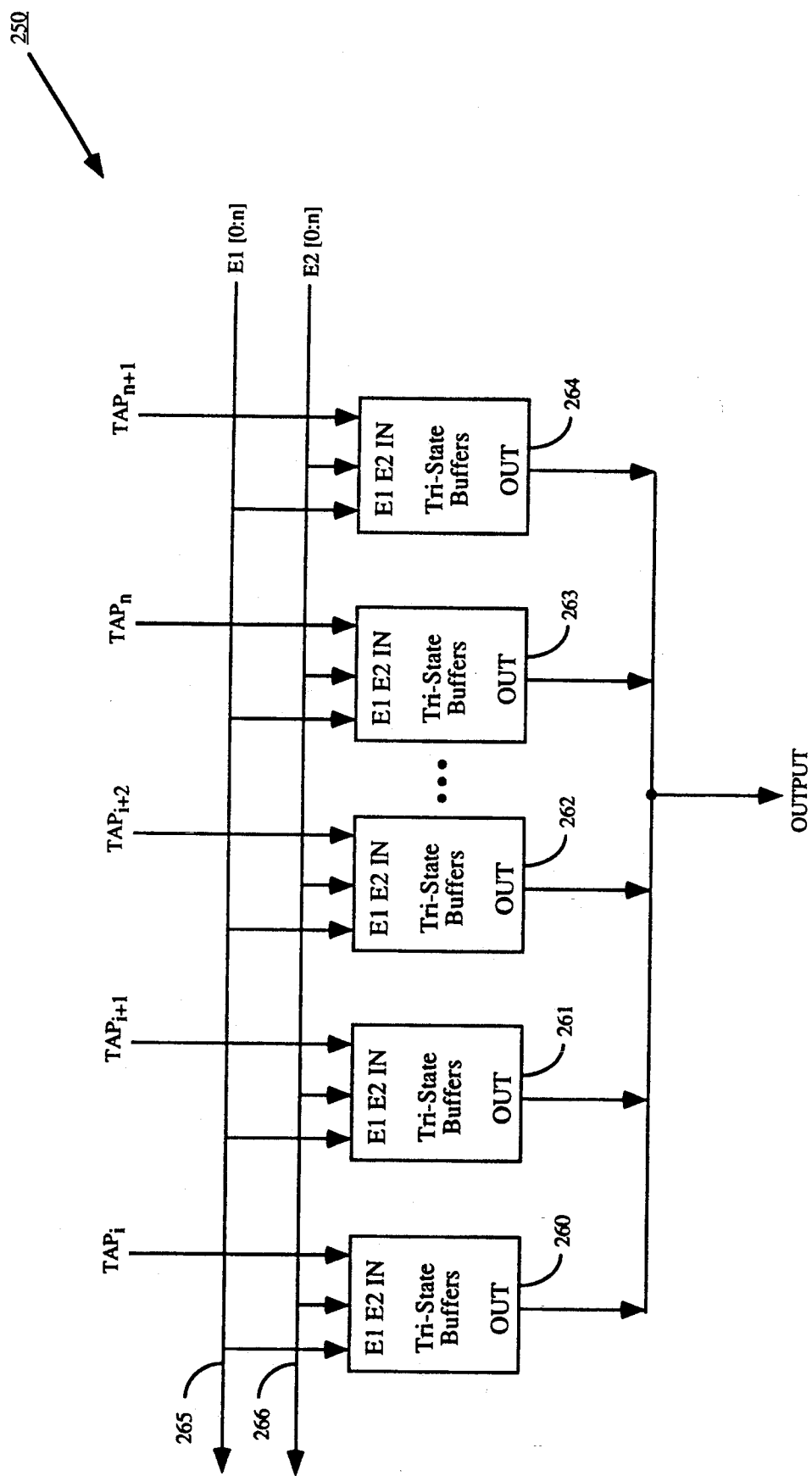
FIG. 30 illustrates the structure of a multiplexer, including a plurality of tri-state buffers.

FIG. 30 illustrates in block diagram form the structure of a multiplexer 250 that can be used for multiplexers 133-137 of FIG. 25, and multiplexers 142-145 of FIG. 26. FIG. 30 illustrates one embodiment of multiplexer 250.

Figure 31:
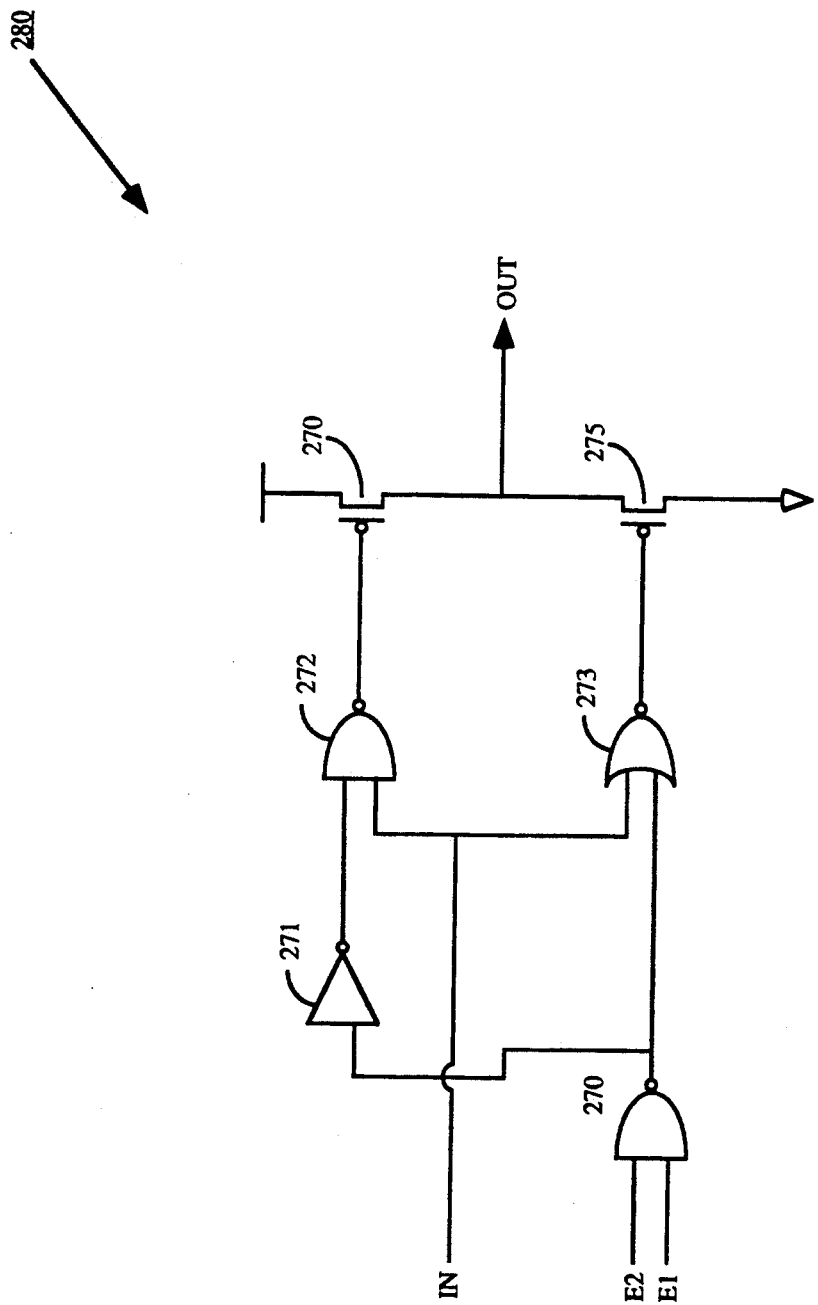
FIG. 31 illustrates the circuit of one tri-state buffer of FIG. 30.

In FIG. 30, multiplexer 250 includes a number of tri-state enable buffers 260-264, each having an input IN and an output OUT. Which one of tri-state enable buffers 260-264 couples its input IN to the output OUTPUT of multiplexer 250 via its output OUT is determined by selection signals E1 and E2 from buses 265 and 266. E1 bus 265 and E2 bus 266 can be received from memory and system slave arbitration circuitry 73 (FIG. 8) and/or PTRs 106-108 (FIG. 12). The circuitry of one of tri-state enable buffers 260-264 is shown in FIG. 31.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory controller apparatus for controlling access to a memory array from a microprocessor and a plurality of peripheral devices, wherein the memory controller apparatus interfaces the microprocessor and the plurality of peripheral devices, wherein the microprocessor functions asynchronously with the plurality of peripheral devices, the memory controller apparatus comprising:
   (A) delay line means coupled to receive a selected request from one of the microprocessor and the plurality of peripheral devices for generating a plurality of memory timing control signals when the selected request is for access to the memory array, wherein the memory timing control signals are used for accessing the memory array, wherein the delay line means functions independently of any clock signal, wherein the delay line means is only triggered by the selected request; and
   (B) memory state circuitry coupled to the delay line means for controlling sequence and timing of the memory timing control signals, wherein the memory state circuitry is clocked by the memory timing control signals.

2. The memory controller apparatus of claim 1, wherein the delay line means generates the memory timing control signals only when the selected request is for access to the memory array.

3. The memory controller apparatus of claim 1, wherein the delay line means comprises a row delay line circuit and a column delay line circuit, each having a plurality of delay means, wherein each of the plurality of delay means provides a controllable delay, wherein each of the plurality of delay means is coupled to receive a control signal for controlling the duration of the delay.

4. The memory controller apparatus of claim 3, further comprising a synchronous delay line means coupled to receive a periodical signal from an external circuitry for generating the control signal, wherein the synchronous delay line means operates synchronously with the periodical signal, wherein the control signal controls the duration of the delay to be insensitive to variations from wafer processing, supply voltage and temperature.

5. The memory controller apparatus of claim 3, wherein each of the row delay line circuit and the column delay line circuit includes a feedback loop for providing a re-trigger signal, wherein the retrigger signal is controlled by the memory state circuitry to be applied to the row and column delay line circuits.

6. The memory controller apparatus of claim 3, wherein the delay line means further includes a host and system delay line circuit coupled between (1) the microprocessor and the plurality of peripheral devices and (2) the memory controller apparatus for generating a beginning delay to the selected request within which the memory controller apparatus can determine if the selected request is to access the memory array before applying the selected request to the row delay line circuit and the column delay line circuit.

7. The memory controller apparatus of claim 1, wherein the memory controller apparatus includes a first port coupled to the microprocessor, a second port coupled to the plurality of peripheral devices, wherein the first port receives a first request from the microprocessor and the second port receives a second request from one of the plurality of peripheral devices.

8. The memory controller apparatus of claim 7, wherein the memory controller apparatus further comprises an arbitration circuitry coupled to the first port and the second port for selecting by arbitration the selected request from the first request and the second request.

9. The memory controller apparatus of claim 7, wherein the first port is also coupled to the second port, wherein when the microprocessor accesses the plurality of peripheral devices through the first port and then the second port of the memory controller apparatus.

10. The memory controller apparatus of claim 9, wherein the delay line means is also triggered by a third request from the microprocessor for accessing the plurality of peripheral devices to generate a plurality of system timing control signals to the plurality of peripheral devices through the second port, wherein the delay line means does not generate the memory timing control signals when the third request is received.

11. The memory controller apparatus of claim 1, wherein the memory array is a dynamic random access memory array.

12. The memory controller apparatus of claim 1, wherein the delay line means comprising:
(i) a plurality of delay elements, each providing an operating condition insensitive delay;
(ii) a plurality of tap means, each is coupled to one of the delay elements, for receiving a plurality of delayed signals of the selected request, wherein the delayed signals include the memory timing control signals; and
(iii) multiplexing means coupled to receive the plurality of delayed signals for selectively applying the memory timing control signals to the memory array.

13. The memory controller apparatus of claim 12, further comprising programmable timing register means for storing timing parameters of the memory timing control signals, wherein the multiplexing means of the delay line means is coupled to the programmable timing register means, wherein the multiplexing means of the delay line means is controlled by the timing parameters to select the memory timing control signals, wherein the timing parameters can be changed by reprogramming by software.

14. A memory controller apparatus having a first port and a second port for controlling access to a memory array from a microprocessor and a plurality of peripheral devices, wherein the memory controller apparatus interfaces the microprocessor at the first port, and interfaces the plurality of peripheral devices at the second port, wherein the microprocessor functions asynchronously with the plurality of peripheral devices, the memory controller apparatus comprising:
(A) arbitration circuitry coupled to receive a first request from the microprocessor and a second request from the plurality of peripheral devices to access the memory array for selecting by arbitration a selected one of the first request and the second request;
(B) delay line means coupled to receive the selected one of the first request and the second request from the arbitration circuitry for generating a plurality of memory timing control signals, wherein the memory timing control signals are used for accessing the memory array, wherein the delay line means functions independent of any clock signal, wherein the delay line means generates the memory timing control signals based on occurrence of the selected one of the first request and the second request; and
(C) memory state circuitry coupled to the delay line means for controlling sequence and timing of the memory timing control signals, wherein the memory state circuitry is triggered by the memory timing control signals.

15. The memory controller apparatus of claim 14, wherein the microprocessor can access the plurality of peripheral devices via the memory controller apparatus by a third request, wherein the memory controller apparatus receives the third request at the first port, wherein the delay line means is also triggered by the third request from the microprocessor through the first port for accessing the plurality of peripheral devices to generate a plurality of system timing control signals to the plurality of pheripheral devices through the second port, wherein the arbitration circuitry is clocked by the delay line means triggered by the third request to arbitrate the third request with conditions of the plurality of peripheral devices, wherein the delay line means does not generate the memory timing control signals when the third request is received.

16. The memory controller apparatus of claim 14, wherein the delay line means does not generate the memory timing control signals when the selected one of the first request and the second request is not received.

17. The memory controller apparatus of claim 14, wherein the delay line means comprising:
(i) a plurality of delay elements, each providing a controllable delay which is operating-condition insensitive, wherein the controllable delay is controlled by a control signal from a synchronous delay line means;
(ii) a plurality of tap means, each is coupled to one of the delay elements, for receiving a plurality of delayed signals of the selected request, wherein the delayed signals include the memory timing control signals; and
(iii) multiplexing means coupled to receive the plurality of delayed signals for selectively applying the memory timing control signals to the memory array.

18. The memory controller apparatus of claim 17, further comprising programmable timing register means for storing timing parameters of the memory timing control signals, wherein the multiplexing means of the delay line means is coupled to the programmable timing register means, wherein the multiplexing means of the delay line means is controlled by the timing parameters to select the memory timing control signals, wherein the timing parameters can be changed by reprogramming by software.

19. The memory controller apparatus of claim 17, wherein the delay line means comprises a row delay line circuit and a column delay line circuit, each having the plurality of delay elements, wherein each of the plurality of delay elements is coupled to receive a control signal for controlling the duration of the delay.

20. The memory controller apparatus of claim 17, further comprising a synchronous delay line means coupled to receive a periodical signal from an external circuitry for generating the control signal, wherein the cynchronous delay line means operates synchronously with the periodical signal, wherein the control signal controls the duration of the delay to be insensitive to variations from wafer processing, supply voltage and temperature.

21. The memory controller apparatus of claim 17, wherein each of the row delay line circuit and the column delay line circuit includes a feedback loop for providing a re-trigger signal, wherein the re-trigger signal is controlled by the memory state circuitry to be applied to the row and column delay line circuits.

22. The memory controller apparatus of claim 17, wherein the delay line means further includes a host and system delay line circuit coupled between (1) the microprocessor and the plurality of peripheral devices and (2) the memory controller apparatus for generating a beginning delay to the selected one of the first and second requests within which the memory controller apparatus can determine if the selected one of the first and second requests is to access the memory array before applying the selected one of the first and second requests to the row delay line circuit and the column delay line circuit.

23. The memory controller apparatus of claim 14, wherein the memory array is a dynamic random access memory array.

24. An integrated delay line apparatus in a memory controller for generating a plurality of memory timing control signals to access a memory array, comprising:
  (A) a host and system delay line circuit coupled to a microprocessor and a plurality of peripheral devices for receiving a request from one of the microprocessor and the plurality of peripheral devices for generating a beginning delay to the request within which the memory controller can determine if the request is a memory access request for accessing the memory array, wherein the microprocessor functions asynchronously with the plurality of peripheral devices;
  (B) a row delay line circuit and a column delay line circuit coupled to receive the request from the host and system delay line circuit if the memory controller determines the request is the memory access request, for generating the memory timing control signals, wherein each of the row delay line circuit and the column delay line circuit comprises:
    (i) a plurality of delay elements, each providing a controllable delay, wherein each of the plurality of delay elements is coupled to receive a control signal from a synchronous delay line means for controlling the duration of the delay;
    (ii) a plurality of tap means, each is coupled to one of the delay elements, for receiving a plurality of delayed signals of the selected request, wherein the delayed signals include the memory timing control signal; and
    (iii) multiplexing means coupled to receive the plurality of delayed signals for selectively applying the memory timing control signals to the memory array; and
  (C) memory state circuitry coupled to the row and column delay line circuits for controlling sequence and timing of the memory timing control signals, wherein the memory state circuitry is clocked by the memory timing control signals.

25. The integrated delay line apparatus of claim 24, wherein the synchronous delay line means is coupled to receive a periodical signal from an external circuitry for generating the control signal, wherein the synchronous delay line means operates synchronously with the periodical signal, wherein the control signal controls the duration of the delay to be insensitive to variations from wafer processing, supply voltage and temperature.

26. The integrated delay line apparatus of claim 24, further comprising programmable timing register means for storing timing parameters of the memory timing control signals, wherein the multiplexing means is controlled by the timing parameters to select the memory timing control signals, wherein the multiplexing means is coupled to the programmable timing register means, wherein the timing parameters can be changed by reprogramming by software.

27. The integrated delay line apparatus of claim 24, wherein each of the row delay line circuit and the column delay line circuit includes a feedback loop for providing a re-trigger signal, wherein the re-trigger signal is controlled by the memory state circuitry to be applied to the row and column delay line circuits.

28. The integrated delay line apparatus of claim 24, wherein the row delay line circuit and the column delay line circuit does not generate the memory timing control signals when the request is not received.

29. A method of generating memory timing control signals in a memory controller apparatus, wherein the memory timing control signals are used to access a memory array, wherein the method comprising the steps of:
  (a) receiving a request from one of a microprocessor and a plurality of peripheral devices, wherein the microprocessor functions asynchronously with the plurality of peripheral devices;
  (b) delaying the request to determine if the request is a memory access request;
  (c) triggering a delay line means with the request to generate the memory timing control signals if the request is the memory access request, wherein the delay line means functions independent of any clock signal, wherein the delay line means is only triggered by the request to generate the memory timing control signals;
  (d) providing a memory state circuitry to control sequence and timing of the memory timing control signals based on type of access to the memory array.

30. The method of claim 29, further comprising a step of stopping generation of the memory timing control signals if the request is not for access to the memory array.

31. The method of claim 29, wherein the memory controller apparatus is coupled to the microprocessor via a first port and to the plurality of peripheral devices via a second port, wherein the step (a) further comprises a step of selecting by arbitration in an arbitration circuit the request if the memory controller apparatus receives a first request at the first port at the same time when it receives a second request at the second port.

32. The method of claim 29, further comprising a step of re-triggering the delay line means with a re-trigger path, wherein the re-triggering step is controlled by the memory state circuitry.

* * * * *